United States Patent
Usui et al.

(10) Patent No.: US 7,565,738 B2
(45) Date of Patent: *Jul. 28, 2009

(54) METHOD FOR MANUFACTURING CIRCUIT DEVICE

(75) Inventors: Ryosuke Usui, Aichi (JP); Hideki Mizuhara, Aichi (JP); Yusuke Igarashi, Gunma (JP); Nobuhisa Takakusaki, Gunma (JP); Hayato Abe, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 264 days.

This patent is subject to a terminal disclaimer.

(21) Appl. No.: 11/138,932

(22) Filed: May 25, 2005

(65) Prior Publication Data

US 2005/0263905 A1    Dec. 1, 2005

(30) Foreign Application Priority Data

May 31, 2004 (JP) ............................ P2004-162656
Jun. 2, 2004 (JP) ............................ P2004-164536

(51) Int. Cl.
*H01K 3/10* (2006.01)

(52) U.S. Cl. ............................ 29/852; 29/830; 29/847; 174/262

(58) Field of Classification Search ............... 29/825, 29/830, 832, 846–849, 852; 174/260, 262; 216/18; 257/700, 758, 774, 787; 361/749; 428/209, 901
See application file for complete search history.

(56) References Cited

U.S. PATENT DOCUMENTS

| 4,372,804 | A | * | 2/1983 | Hanabusa et al. | ............ 174/256 |
| 6,010,768 | A | * | 1/2000 | Yasue et al. | ................. 428/209 |
| 6,432,748 | B1 | * | 8/2002 | Hsu | ............................ 29/852 |
| 6,912,779 | B2 | * | 7/2005 | Naitoh et al. | ................. 29/852 |
| 2006/0001166 | A1 | * | 1/2006 | Igarashi et al. | ............... 257/758 |

FOREIGN PATENT DOCUMENTS

| JP | 06-177295 | 6/1994 |
| JP | 09-321432 | 12/1997 |
| JP | 2001-339151 | 12/2001 |
| JP | 2002-185097 | 6/2002 |
| JP | 2004-63722 | 2/2004 |
| JP | 2004-140176 | 5/2004 |

* cited by examiner

Primary Examiner—Donghai D. Nguyen
(74) Attorney, Agent, or Firm—Fish & Richardson P.C.

(57) ABSTRACT

A method for manufacturing a circuit device, which is suitable for connecting a plurality of laminated wiring layers to each other through an insulating layer, is provided. In a method for manufacturing a hybrid integrated circuit device of the present invention, a first wring layer is formed by laminating a first conductive film on a first insulating layer, and patterning the first conductive film. In the first wiring layer, a first connection part which is protruded in a thickness direction is formed. Moreover, the first wiring layer including the first connection part is covered with a second insulating layer. The second insulating layer is formed of a first resin film and a second resin film. The second resin film contains fewer inorganic fillers than the first resin film. Thus, there is an advantage that a through-hole can be easily formed.

9 Claims, 26 Drawing Sheets

METHOD FOR MANUFACTURING CIRCUIT DEVICE

Priority is claimed to Japanese Patent Application Number JP2004-162656 filed on May 31, 2004 and Japanese Patent Application Number JP2004-164536 filed on Jun. 2, 2004, the disclosure of which is incorporated herein by reference in its entirety.

BACKGROUND OF THE INVENTION

1. Field of the Invention

The present invention relates to a method for manufacturing a circuit device, and more particularly relates to a method for manufacturing a circuit device including a plurality of wiring layers laminated with an insulating layer interposed therebetween.

2. Description of the Related Art

With reference to FIG. 25, a description will be given of a configuration of a conventional circuit device 100. This technology is described for instance in Japanese Patent Application Publication No. 2001-339151 (FIG. 1 in p. 1). FIG. 25 is a cross-sectional view of the conventional circuit device.

In the conventional circuit device 100, a first conductive pattern 102A is formed on the surface of a supporting substrate 101, and a second conductive pattern 102B is formed on the rear surface of the supporting substrate 101. In addition, a semiconductor element 104 and a chip element 106 are fixed on the first conductive pattern 102A. The first conductive pattern 102A and the semiconductor element 104 are electrically connected to each other with thin metal wires 105. Moreover, the first conductive pattern 102A and the elements mounted on the first conductive pattern 102A are sealed with a sealing resin 103. As a method for sealing with the sealing resin 103, there are injection molding using a thermoplastic resin, and transfer molding using a thermosetting resin.

Moreover, the first conductive pattern 102A formed on the surface of the supporting substrate 101 and the second conductive pattern 102B formed on the rear surface of the supporting substrate 101 are connected to each other through a contact hole 108. The contact hole 108 is formed by burying a conductor in a hole formed in a manner to penetrate the supporting substrate 101.

Furthermore, with reference to FIGS. 26A and 26B, a description will be given of a configuration of a conventional hybrid integrated circuit device 200. This technology is described for instance in Japanese Patent Application Publication No. Hei 6 (1994)-177295. FIG. 26A is a perspective view of the hybrid integrated circuit device 200, and FIG. 26B is a cross-sectional view along the line X-X' in FIG. 26A.

The conventional hybrid integrated circuit device 200 includes a rectangular substrate 206, and an insulating layer 207 provided on the surface of the substrate 206. On this insulating layer 207, a wiring layer 208 is patterned. Furthermore, a circuit element 204 is fixed on the wiring layer 208, and the circuit element 204 and the wiring layer 208 are electrically connected to each other by use of thin metal wires 205. Leads 201 electrically connected to the wiring layer 208 are extended to the outside. Moreover, the entire hybrid integrated circuit device 200 is sealed with a sealing resin 202. As a method for sealing the device with the sealing resin 202, there are injection molding using a thermoplastic resin, and transfer molding using a thermosetting resin.

However, in the circuit device 100 described above, a substrate made of an organic material such as an epoxy resin is used as the supporting substrate 101. The reason why such a substrate made of the organic material is used is because of consideration for workability in forming the contact hole 108. However, since an organic substrate such as a glass epoxy substrate has a low thermal conductivity, there is a problem that heat generated from embedded elements cannot be efficiently released to the outside. Moreover, if a resin having a large amount of inorganic fillers mixed therein is used as a material of the supporting substrate 101 in order to improve heat release properties of the supporting substrate 101, there arises a problem that formation of the contact hole 108 becomes difficult.

Furthermore, in the hybrid integrated circuit device 200 described above, formation of a single layer wiring leads to a problem that limits a size of an electric circuit that can be integrated. As one of methods for solving this problem, there is a method for forming a multilayer structure of wirings laminated with an insulating layer interposed therebetween. The laminated wiring layers are electrically connected to each other through a connection part formed in a manner to penetrate the insulating layer. Moreover, in consideration for heat release properties, the insulating layer has inorganic fillers mixed therein. However, if a large amount of inorganic fillers are mixed in the insulating layer in order to improve the heat release properties, there arises a problem that formation of the connection part which penetrates the insulating layer becomes difficult. Specifically, it is difficult to form a multilayer wiring structure which secures the heat release properties.

SUMMARY OF THE INVENTION

The present invention was made in consideration for the foregoing problems. The main object of the present invention is to provide a method for manufacturing a circuit device which is suitable for connecting a plurality of laminated wiring layers to each other through an insulating layer.

A method for manufacturing a circuit device of the present invention includes the steps of: forming a first wiring layer on the surface of a circuit board, the first wiring layer having a first connection part protruded in a thickness direction; laminating a conductive film on the first wiring layer with an insulating layer containing fillers interposed therebetween; partially removing the conductive film corresponding to a region where the first connection part is formed; forming a through-hole by removing the insulating layer in a region thinly formed by burying the first connection part, and exposing the upper surface of the first connection part to a lower side of the through-hole; connecting the conductive film and the first wiring layer by forming a second connection part in the through-hole; and forming a second wiring layer by patterning the conductive film.

A method for manufacturing a circuit device of the present invention includes the steps of: forming a first connection part protruded in a thickness direction of a first conductive film; laminating a second conductive film on an insulating layer containing fillers which is formed on the surface of the first conductive film so as to bury the first connection part; partially removing the second conductive film corresponding to a region where the first connection part is formed; forming a through-hole by removing the insulating layer in a region thinly formed by burying the first connection part, and exposing the upper surface of the first connection part to a lower side of the through-hole; connecting the first conductive film and the second conductive film by forming a second connection part in the through-hole; and forming a first wiring layer and a second wiring layer by patterning the first conductive film and the second conductive film.

In the method for manufacturing a circuit device of the present invention, the insulating layer is formed of a first resin film containing fillers and a second resin film which covers the upper surface of the first resin film and contains fewer fillers than the first resin film. In addition, the through-hole is formed by removing the second resin film positioned above the first connection part.

In the method for manufacturing a circuit device of the present invention, the second resin film contains no fillers.

In the method for manufacturing a circuit device of the present invention, the through-hole is formed in such a manner that the insulating layer is exposed by partially removing the second conductive film, and the exposed insulating layer is irradiated with a laser and removed.

In the method for manufacturing a circuit device of the present invention, after a plated film is formed on a sidewall of the through-hole by electroless plating, electrolytic plating is performed. Thereafter, a new plated film is formed in the through-hole. Thus, the first and second conductive films are connected to each other.

In the method for manufacturing a circuit device of the present invention, by performing electrolytic plating using the second conductive film as an electrode, a plated film is formed toward inside of the through-hole from the second conductive film positioned around the through-hole. Thus, the first and second conductive films are connected to each other by use of the plated film.

In the method for manufacturing a circuit device of the present invention, a canopy top made of the second conductive film is formed around the through-hole, and a plated film is formed toward inside of the through-hole from the canopy top.

In the method for manufacturing a circuit device of the present invention, by performing electrolytic plating using the first conductive film as an electrode, a plated film is formed toward the inside of the through-hole from the first conductive film exposed to a lower side of the through-hole. Thus, the first and second conductive films are connected to each other by use of the plated film.

In the method for manufacturing a circuit device of the present invention, before the plated film is formed, metal different from the plated film is attached to the sidewall of the through-hole.

According to the method for manufacturing a circuit device of the present invention, by providing a through-hole in an insulating layer which is thinly formed by burying a first connection part, the through-hole can be easily formed in the insulating layer. In addition, a planar size of the through-hole formed can be reduced. Moreover, since the through-hole can be formed to be shallow, a plated film can be easily formed in the through-hole. Furthermore, by attaching metal different from the plated film to a sidewall of the through-hole before formation of the plated film, the plated film can be easily formed.

DESCRIPTION OF THE EMBODIMENTS

First Embodiment

Figure 1A:
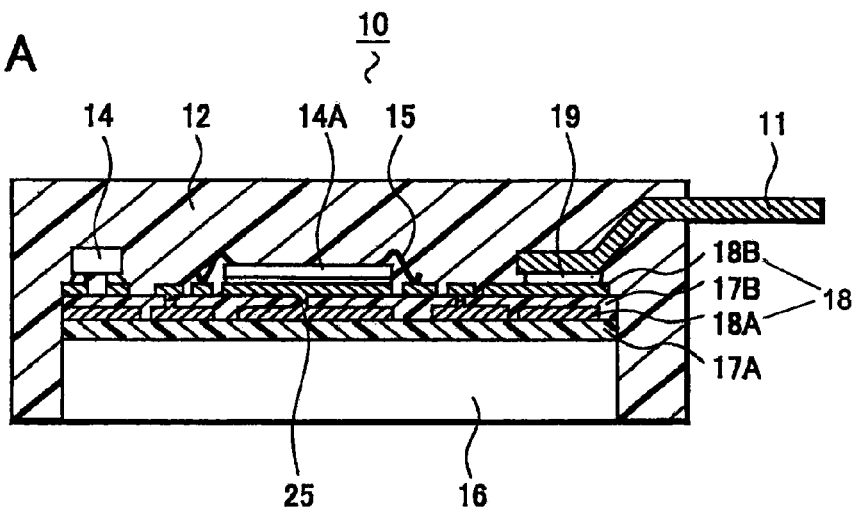
FIGS. 1A to 1C are cross-sectional views showing a hybrid integrated circuit device of the preferred embodiment of the present invention.
Figure 1B:
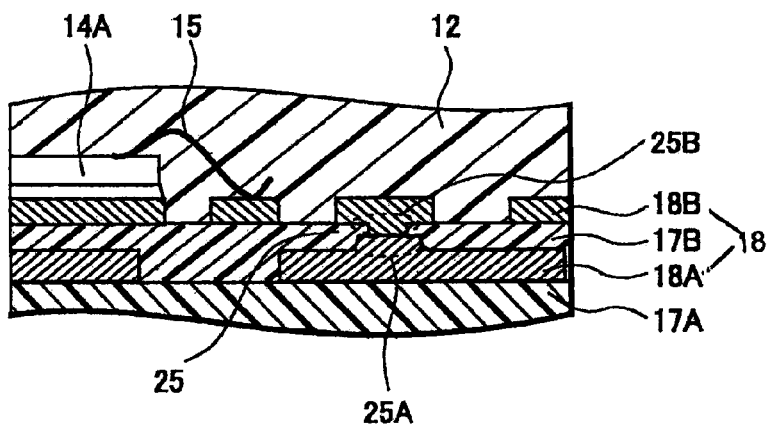
Figure 1C:
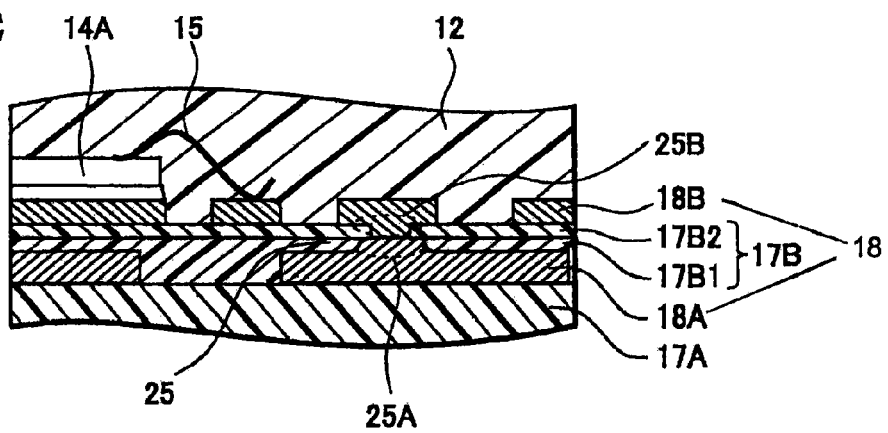

In this embodiment, as an example of a circuit device, a hybrid integrated circuit device as shown in FIGS. 1A to 1C and the like will be described. However, the embodiment described below is also applicable to other kinds of circuit devices.

With reference to FIGS. 1A to 1C, a configuration of a hybrid integrated circuit device 10 of the present invention will be described. FIG. 1A is a cross-sectional view of the hybrid integrated circuit device 10, and FIG. 1B is an enlarged cross-sectional view of a connection part 25 and the vicinity thereof. FIG. 1C is an enlarged cross-sectional view of the connection part 25 for showing a cross-sectional configuration of another configuration.

In the hybrid integrated circuit device 10, with reference to FIG. 1A, an electric circuit including a wiring layer 18 and a circuit element 14 is formed on the surface of a circuit board 16 which functions as a supporting board. Moreover, the electric circuit formed on the surface of the circuit board 16 is sealed with a sealing resin 12. In a periphery of the circuit board 16, a lead 11 is fixed to the uppermost wiring layer 18, and an end of the lead 11 is extended to the outside of the sealing resin 12. In this embodiment, the wiring layer 18 has a multilayer wiring structure. Here, a two-layer wiring structure is realized, which includes a first wiring layer 18A and a second wiring layer 18B. The respective wiring layers 18 are laminated with insulating layers interposed therebetween. The hybrid integrated circuit device 10 having such a configuration will be described in detail below.

In terms of heat release, a board made of metal, ceramic or the like may be used as the circuit board 16. Moreover, for a material of the circuit board 16, Al, Cu, Fe or the like can be used as metal, and $Al_2O_3$ or AlN can be used as ceramic. Besides the above, a material excellent in mechanical strength or heat release properties can be used as the material of the circuit board 16. Moreover, in order to only realize a contact structure that is the point of the present application, a flexible board, a printed board, a glass epoxy board, or the like can be adopted.

In this embodiment, an insulating layer 17 is formed on the surface of the circuit board 16 made of aluminum, and the wiring layer 18 is formed on the surface of the insulating layer 17. In addition, in this embodiment, metal mainly made of copper can be adopted as the material of the circuit board 16. Since copper has an excellent thermal conductivity, the heat release properties of the entire device can be improved. Moreover, if Al is used as the material of the circuit board 16, aluminum oxide may be formed at least on the front surface in consideration of the mechanical strength.

A first insulating layer 17A is formed on the surface of the circuit board 16 so as to substantially cover the entire surface thereof. As the first insulating layer 17A, a resin containing fillers can be used. Here, as the fillers, for example, aluminum compounds, calcium compounds, potassium compounds, magnesium compounds or silicon compounds can be used. Moreover, in order to improve the heat release properties of the entire device, the first insulating layer 17A contains more fillers than the other insulating layer, and a filler content is, for example, about 60% to 80%. Furthermore, the heat release properties can also be improved by mixing fillers having a large diameter of 50 μm or more in the first insulating layer 17A. A thickness of the first insulating layer 17A is changed depending on a required withstand voltage, and may be about 50 μm to several hundred μm.

The first wiring layer 18A is made of metal such as copper, and is patterned on the surface of the first insulating layer 17A. The first wiring layer 18A is electrically connected to the second wiring layer 18B thereabove, and mainly has a function of extending a pattern.

A second insulating layer 17B is formed on the surface of the circuit board 16 so as to cover the first wiring layer 18A. In the second insulating layer 17B, the connection part 25 which electrically connects the first wiring layer 18A and the second wiring layer 18B is formed in a manner to penetrate the second insulating layer 17B. Therefore, in order to facilitate formation of the connection part 25, the second insulating layer 17B may contain fewer fillers than the first insulating layer 17A. This means that the second insulating layer 17B has a smaller content of fillers. Furthermore, for the same reason, an average particle diameter of the fillers contained in the second insulating layer 17B may be smaller than that of the fillers contained in the first insulating layer 17A.

The second wiring layer 18B is formed on the surface of the second insulating layer 17B. The second wiring layer 18B forms a land on which the circuit element 14 is mounted, pads connected to electrodes on the circuit element, a wiring part which electrically connects the pads, a pad on which the lead 11 is fixed, and the like. Moreover, the second wiring layer 18B and the first wiring layer 18A can be formed so as to planarly intersect with each other. Therefore, even if a semiconductor element 14A has a number of electrodes, the multilayer wiring structure of the present application enables a crossover and makes it possible to freely extend the pattern. The second wiring layer 18B and the first wiring layer 18A described above are connected to each other in desired spots through the connection part 25. It is needless to say that, in accordance with the number of electrodes of the semiconductor element, a packaging density of elements, and the like, 3, 4, 5 or more of wiring layers can also be provided.

The connection part 25 is a part where the second insulating layer 17B is penetrated and the first wiring layer 18A and the second wiring layer 18B are electrically connected. In this embodiment, the connection part 25 is formed of a first connection part 25A extended continuously from the first wiring layer 18A, and a second connection part 25B extended continuously from the second wiring layer 18B. More details about the connection part 25 will be described later with reference to FIG. 1C.

The circuit element 14 such as a semiconductor element is fixed onto the second wiring layer 18B, and the circuit element 14 and the wiring layer 18 form a predetermined electric circuit. As the circuit element 14, an active element such as a transistor, a diode, an IC, and a system LSI or a passive element such as a condenser and a resistor is adopted. Moreover, an element with a large calorific value such as a power semiconductor element may be fixed to the circuit board 16 with a heat sink interposed therebetween, the heat sink being made of metal. Here, since the semiconductor element 14A is a face up type, the element is electrically connected to the second wiring layer 18B with a thin metal wire 15. However, the semiconductor element 14A may be mounted face down.

The semiconductor element 14A is one having several dozen to several hundred pads on its surface. Moreover, a so-called system LSI can also be adopted as the semiconductor element 14A. Here, the system LSI means a large scale element which has an analog computing circuit, a digital computing circuit, a storage part or the like, and realizes system functions in one LSI. Therefore, compared to a conventional LSI, the system LSI is operated with generation of a large amount of heat.

Moreover, if the rear surface of the semiconductor element 14A is connected to a ground potential, the rear surface thereof is fixed by use of a brazing material, a conductive paste or the like. Moreover, if the rear surface of the semiconductor element 14A is in a floating state, the rear surface thereof is fixed by use of an insulating adhesive. Note that, if the semiconductor element 14A is mounted face down, the element is mounted by a bump electrode made of solder or the like.

Furthermore, as the semiconductor element 14A, a power transistor which controls a large current, for example, a power MOS, a GTBT, an IGBT, a thyristor, and the like can be adopted. Moreover, a power IC can also be adopted as the semiconductor element 14A.

The lead 11 is fixed to the second wiring layer 18B in the periphery of the circuit board 16, and has a function of performing input/output from/to the outside, for example. Although, here, a number of the leads 11 are provided on one side, the leads may be arranged on two opposite sides or four sides. The leads 11 are attached to the pattern by use of a brazing material 19 such as solder.

The sealing resin 12 is formed by transfer molding using a thermosetting resin or by injection molding using a thermoplastic resin. Here, the sealing resin 12 is formed so as to seal the circuit board 16 and the electric circuit formed on the surface thereof, and the rear surface of the circuit board 16 is exposed from the sealing resin 12. Moreover, as a sealing method other than sealing by molding, for example, well-known sealing methods such as sealing by potting and sealing by use of a case material can be applied. With reference to FIG. 1A, in order to suitably release heat to the outside, the heat being generated from the circuit element 14 mounted on the surface of the circuit board 16, the rear surface of the circuit board 16 is exposed to the outside of the sealing resin 12. Moreover, in order to improve moisture resistance of the entire device, it is also possible to seal the entire device including the rear surface of the circuit board 16 by use of the sealing resin 12.

With reference to the cross-sectional view of FIG. 1B, the connection part 25 will be described in detail. FIG. 1B is an enlarged cross-sectional view of the hybrid integrated circuit device 10, showing the connection part 25 and the vicinity thereof. The connection part 25 is a part which connects the laminated wiring layers 18 to each other through the insulating layer 17. Moreover, the connection part 25 can also be used as a thermal via for thermally connecting the wiring layers 18 to each other.

In this embodiment, the connection part 25 including the first connection part 25A and the second connection part 25B is formed. The first connection part 25A is a part protruded continuously from the first wiring layer 18A in its thickness direction. Here, the first connection part 25A is protruded upward and buried in the second insulating layer 17B. The second connection part 25B is a part protruded continuously from the second wiring layer 18B in its thickness direction. Here, the second connection part 25B is protruded downward and buried in the second insulating layer 17B.

The first connection part 25A is formed by etching processing so as to be protruded in the thickness direction, and is made of a Cu foil formed by plating or calendering. Moreover, the first connection part 25A can also be formed by use of a method other than etching processing. To be more specific, by depositing an electrolytic plated film or an electroless plated film so as to form a convex shape on the surface of the first wiring layer 18A, the first connection part 25A can be formed. Moreover, it is also possible to form the first connection part 25A by providing a conductive material such as a brazing material including solder and the like, and a silver paste on the surface of the first wiring layer 18A.

The second connection part 25B is a part formed by plating processing such as electrolytic plating and electroless plating. A method for forming the second connection part 25B will be described later in an embodiment for explaining a manufacturing method.

In this embodiment, a spot where the above-described the first and the second connection parts 25A and 25B come into contact with each other is positioned in an intermediate portion of the second insulating layer 17B in its thickness direction. Here, the intermediate portion means a portion that is above the upper surface of the first wiring layer 18A and is below the lower surface of the second wiring layer 18B. Therefore, although the spot where the first and the second connection parts 25A and 25B come into contact with each other is around the center portion of the second insulating layer 17B in its thickness direction on the page space, the spot can be changed within a range of the intermediate portion described above. Considering the case where the second connection part 25B is formed by plating processing, the portion where the first and the second connection parts 25A and 25B come into contact with each other is preferably disposed above an intermediate position between the upper surface of the first wiring layer 18A and the lower surface of the second wiring layer 18B. Thus, there is an advantage that formation of the second connection part 25B made of the plated film is facilitated. Specifically, as is made clear by the manufacturing method to be described later, a via is formed to form the second connection part, and a depth of this via can be reduced. Moreover, as the via is formed to be shallow, a diameter of the via can be reduced. Furthermore, as the diameter of the via is reduced, an interval is narrowed, and an entire minute pattern can be realized.

Moreover, the first wiring layer 18A can also be formed to be partially thick. Accordingly, the first wiring layer 18A which is formed to be thick can be used as a power electrode or wiring. In addition, it is possible to form a miniaturized wiring by use of the first wiring layer 18A in other regions which is thinly formed.

With reference to FIG. 1C, a description will be given of a cross section of a hybrid integrated circuit device of another configuration. Here, the second insulating layer 17B positioned between the respective wiring layers 18 is formed of a first resin film 17B1 and a second resin film 17B2. The first resin film 17B1 is made of an insulating resin containing inorganic fillers, and covers the first wiring layer 18A including the surface of the first insulating layer 17A. Here, the first resin film 17B1 is formed so as to cover the first wiring layer 18A in a portion lower than the upper surface of the first connection part 25A. The second resin film 17B2 is formed so as to cover the upper surface of the first resin film 17B1 described above. The second resin film 17B2 is made of a resin containing fewer inorganic fillers than the first resin film 17B1. Moreover, an average particle diameter of the inorganic fillers contained in the second resin film 17B2 may be set smaller than that of the inorganic fillers contained in the first resin film 17B1. Thus, there is an advantage that a through-hole is easily formed in the second resin film 17B2. Furthermore, there is also an advantage that a plated film is easily formed in the through-hole formed.

Figure 2:
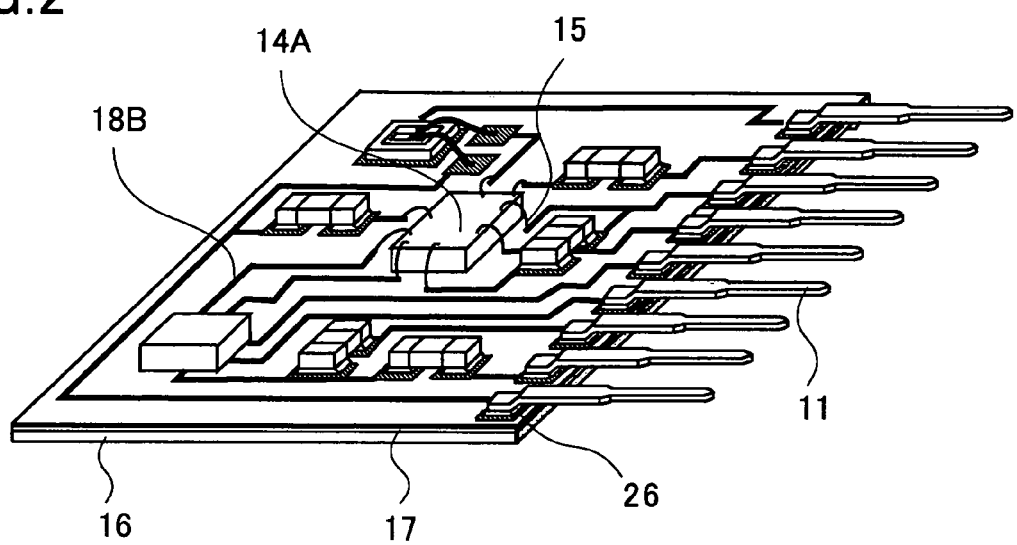
FIG. 2 is a perspective view showing the hybrid integrated circuit device of the preferred embodiment of the present invention.

With reference to a perspective view of FIG. 2, a description will be given of an example of a specific shape of the second wiring layer 18B formed on the surface of the circuit board 16. In FIG. 2, the resin for sealing the entire device is omitted.

With reference to FIG. 2, the second wiring layer 18B forms bonding pads on which the circuit elements 14 including a semiconductor element are mounted, pads 26 to which the leads 11 are fixed, and the like. Moreover, around the semiconductor element 14A, a number of pads are formed, to which the thin metal wires 15 are wire-bonded. In the case where the semiconductor element 14A having a number of bonding pads is mounted, a wiring density is limited in a single layer pattern including only the second wiring layer 18B. Thus, the pattern may not be sufficiently extended. In this embodiment, by constructing a multilayer wiring structure on the surface of the circuit board 16, a complex pattern extension is realized.

Figure 3A:
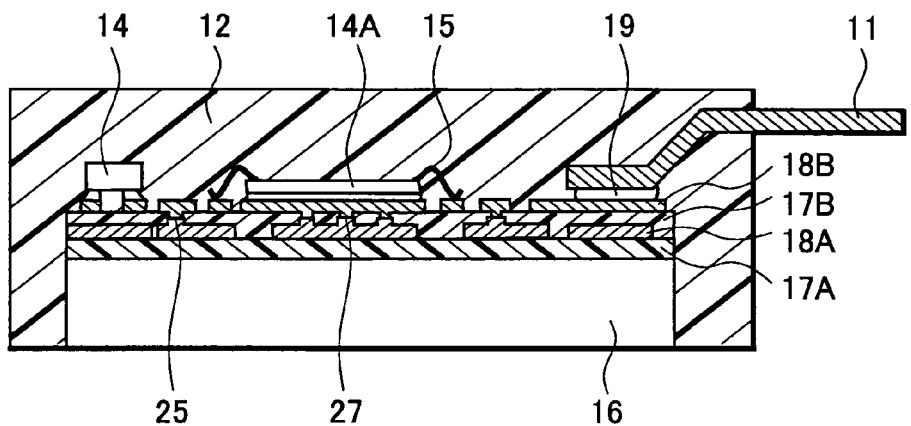
FIGS. 3A and 3B are cross-sectional views showing the hybrid integrated circuit device of the preferred embodiment of the present invention.
Figure 3B:
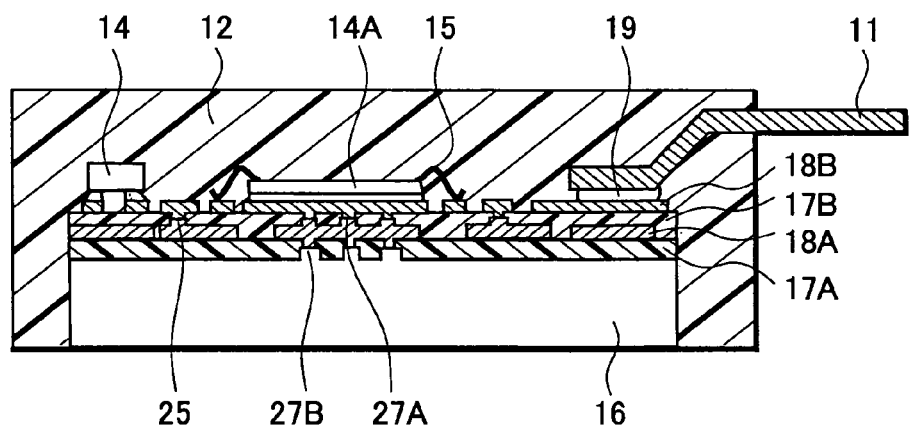

With reference to FIGS. 3A and 3B, a configuration of a hybrid integrated circuit device of another configuration will be described. FIGS. 3A and 3B are cross-sectional views of the hybrid integrated circuit device of the configuration.

With reference to FIG. 3A, here, a thermal via 27 is formed in a manner to penetrate the second insulating layer 17B. The thermal via 27 is a part formed by filling a hole penetrating the second insulating layer 17B with metal, and functions as a path of heat to the outside. Therefore, the thermal via 27 may not function as an electrical path. To be more specific, the thermal via 27 is formed so as to come into contact with the lower surface of the land-shaped second wiring layer 18B to which the semiconductor element 14A is fixed. Therefore, even if a large amount of heat is generated from the semiconductor element 14A, the heat is transmitted to the circuit board 16 through a plurality of the thermal vias 27. In this case, a path of the heat is from the semiconductor element 14A to the outside through the second wiring layer 18B, the thermal via 27, the first insulating layer 17A, and the circuit board 16. Here, the thermal via 27 is formed of the first and the second connection parts 25A and 25B described above. In addition, a portion where the first and the second connection parts 25A and 25B come into contact with each other is an intermediate portion of the insulating layer in its thickness direction. The thermal via 27 functions as the path of heat, and is a part on which a large thermal stress is expected to act. Thus, the configuration of this configuration is significant.

With reference to FIG. 3B, here, the thermal vias 27 are provided in both of the first insulating layer 17A and the second insulating layer 17B. As described above, the first insulating layer 17A containing a large amount of fillers has excellent heat release properties. Therefore, by providing a thermal via 27B in the first insulating layer 17A as shown in FIG. 3B, the heat release properties can be further improved. The thermal via 27B provided in the first insulating layer 17A may also be provided in a region corresponding to a lower side of the semiconductor element 14A which generates heat.

In the case where the thermal via 27B is formed between the circuit board 16 and the first insulating layer 17A as described above, the first connection part 25A protruded in a convex shape is formed on the surface of the circuit board 16. Moreover, the second connection part 25B is provided on the rear surface of the first wiring layer 18A. Accordingly, the first and the second connection parts 25A and 25B are allowed to come into contact with each other in an intermediate portion of the first insulating layer 17A.

Figure 4A:
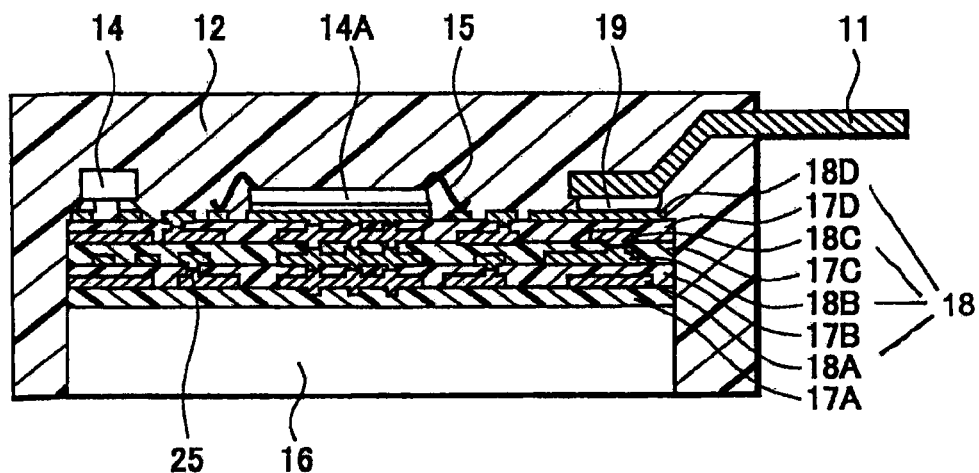
FIGS. 4A and 4B are cross-sectional views showing the hybrid integrated circuit device of the preferred embodiment of the present invention.
Figure 4B:
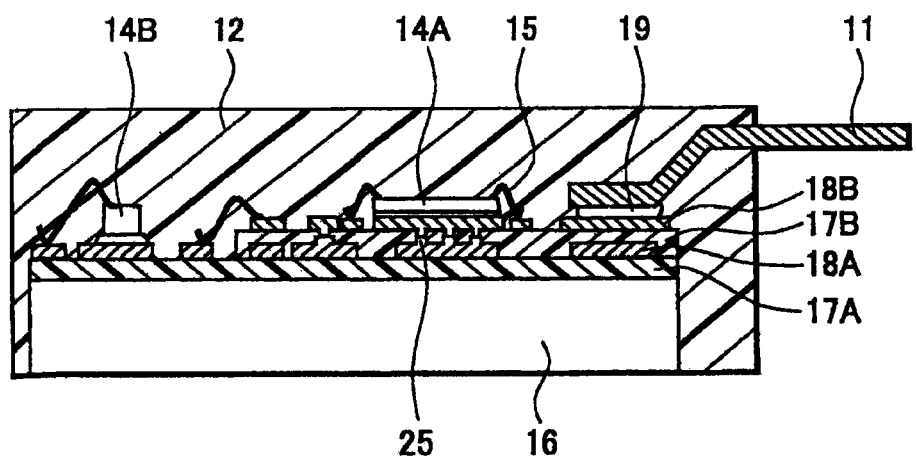

With reference to FIGS. 4A and 4B, a description will be given of structures of hybrid integrated circuit devices of still other configurations. FIGS. 4A and 4B are cross-sectional views of the hybrid integrated circuit devices.

With reference to FIG. 4A, here, a four-layer wiring structure is formed by laminating wiring layers 18 with the insulating layers 17 interposed therebetween. To be more specific, the first wiring layer 18A is formed on the first insulating layer 17A. Thereafter, the second to a fourth wiring layers 18B to 18D are laminated with the second to a fourth insulating layers 17B to 17D interposed therebetween. As described above, by increasing the number of the wiring layers 18, a wiring density can be improved. In the second to the fourth insulating layers 17B to 17D, the connection parts 25 are formed to connect the respective wiring layers to each other.

With reference to FIG. 4B, here, a multilayer wiring structure is formed on the surface of the circuit board 16 in a region where the semiconductor element 14A having a number of pads is mounted. Meanwhile, a single-layer wiring structure is formed on the surface of the circuit board 16 in a region where a circuit element 14B is fixed.

The semiconductor element 14A is an element having several dozen to several hundred electrodes as described above. Therefore, in order to extend a pattern which is connected to the electrodes of the semiconductor element 14A, the multilayer wiring structure is formed around the semiconductor element 14A. To be more specific, a multilayer wiring structure including the first and the second wiring layers 18A and 18B is formed.

Moreover, the second wiring layer 18B formed to have a multilayer structure and the first wiring layer 18A formed to have a single-layer structure are electrically connected to each other through the thin metal wires 15.

The circuit element 14B is, for example, a power semiconductor element, and is a switching element which generates a large amount of heat. A region of the circuit board 16 where the single-layer wiring structure including the first wiring layer 18A is formed has a heat release effect larger than those of other regions. Therefore, a discrete transistor which has a large calorific value such as the circuit element 14B may be directly fixed to the first wiring layer 18A which forms the single-layer wiring.

Second Embodiment

In this embodiment, a description will be given of a method for manufacturing a hybrid integrated circuit device as an example of a circuit device.

Figure 5A:
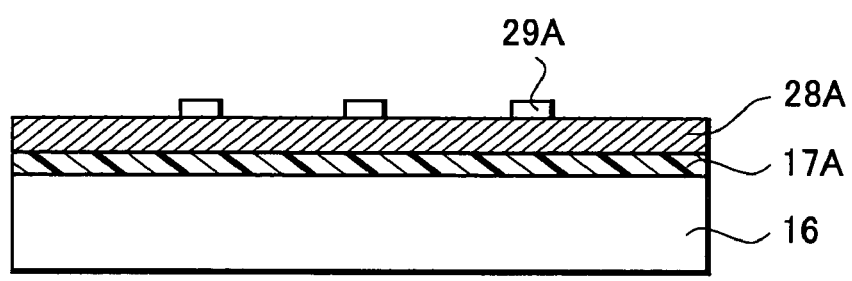
FIGS. 5A to 5C are cross-sectional views showing a method for manufacturing a hybrid integrated circuit device of the preferred embodiment of the present invention.

First, with reference to FIG. 5A, a first insulating layer 17A is applied onto the surface of a circuit board 16, and a first conductive film 28A is laminated thereon. As the circuit board 16, a metal plate having a thickness of about 1.5 mm can be used. Moreover, as the first conductive film 28A, a material mainly made of copper or a material mainly made of Fe—Ni or Al can be used. For a thickness of the first conductive film 28A, more than a thickness obtained by adding a thickness of a wiring layer 18 to be formed and a height of a first connection part 25A is required. To be more specific, the thickness of the first conductive film 28A is, for example, about 20 μm to 150 μm. A resist 29A covers the surface of the first conductive film 28A in a region where the first connection part 25A will be formed. In a state where the resist 29A covers the surface, etching is performed. Moreover, as the first insulating layer 17A, one obtained by mixing inorganic fillers in an insulating resin such as an epoxy resin can be used. Here, as the inorganic fillers to be mixed in, $SiO_2$, $Al_2O_3$, SiC, AlN, or the like can be used.

Figure 5B:
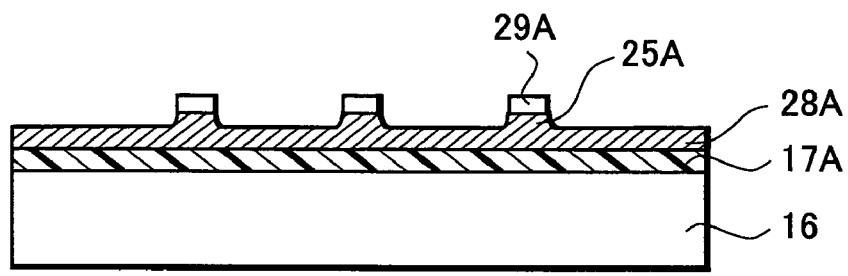
Figure 5C:
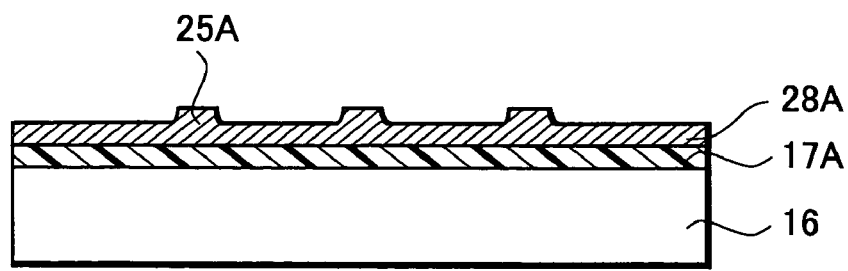

FIG. 5B shows a cross section in a state after etching is performed. Here, the region covered with the resist 29A is protruded in a convex shape. The portion protruded in the convex shape forms the first connection part 25A. The first conductive film 28A in the region where etching is performed with the surface exposed is formed to be uniformly thin. After this step is finished, the resist 29A is removed. Here, a height of protrusion of the first connection part 25A is adjusted to about several ten μm. FIG. 5C shows the first connection part 25A in the state where the resist 29A is removed.

Next, with reference to FIGS. 6A to 6C, a description will be given of another method for forming the first connection part 25A on the surface of the first conductive film 28A. Here, the first connection part 25A is formed by selectively forming a plated film on the surface of the first conductive film 28A.

Figure 6A:
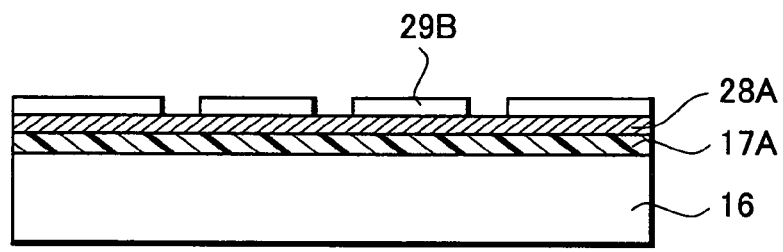
FIGS. 6A to 6C are cross-sectional views showing the method for manufacturing a hybrid integrated circuit device of the preferred embodiment of the present invention.

With reference to FIG. 6A, first, a resist 29B is selectively formed on the surface of the first conductive film 28A. To be more specific, the resist 29B is formed on the surface except for a region where the first connection part 25A will be formed.

Figure 6B:
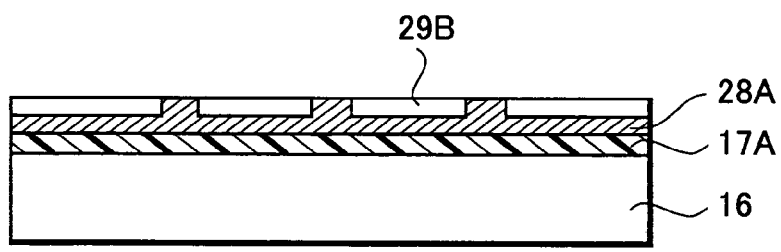
Figure 6C:
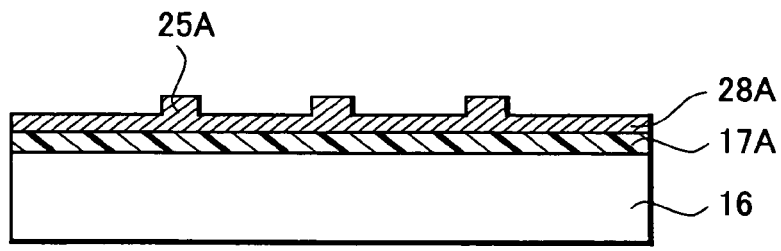

Next, with reference to FIG. 6B, a plated film is grown on the surface of the first conductive film 28A which is selectively exposed from the resist 29B. For formation of the plated film, electrolytic plating, electroless plating or a method combining the both can be adopted. After this step is finished, the resist 29B is removed, and the first connection part 25A having a convex shape as shown in FIG. 6C is obtained.

Figure 7A:
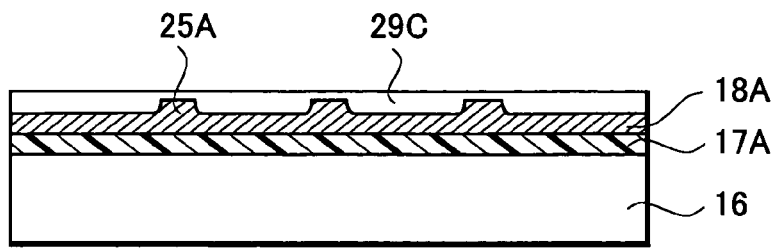
FIGS. 7A to 7D are cross-sectional views showing the method for manufacturing a hybrid integrated circuit device of the preferred embodiment of the present invention.
Figure 7B:
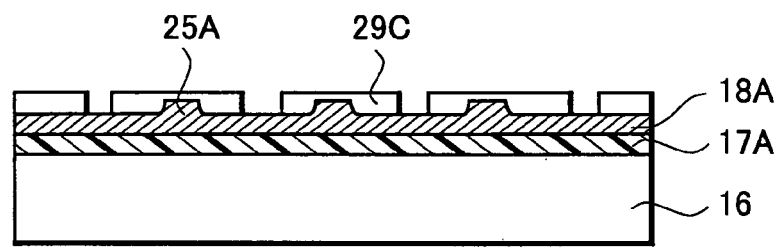
Figure 7C:
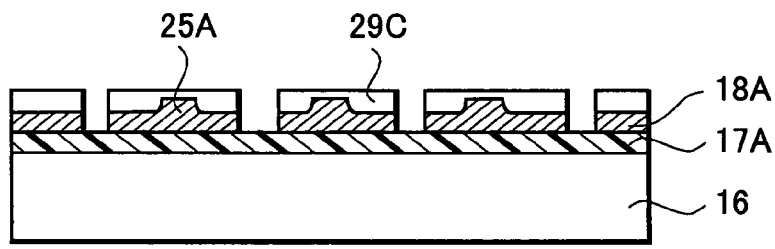
Figure 7D:
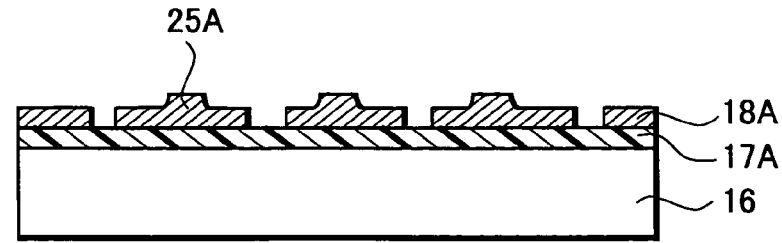

With reference to FIGS. 7A to 7C, next, a first wiring layer 18A including the upper surface of the first connection part 25A is covered with a resist 29C. Moreover, the resist 29C is patterned. Thereafter, by performing etching through the resist 29C, the first wiring layer 18A is patterned. After etching of the first wiring layer 18A is finished, the resist 29C is removed. FIG. 7D shows a cross section in a state after the resist 29C is removed.

Figure 8A:
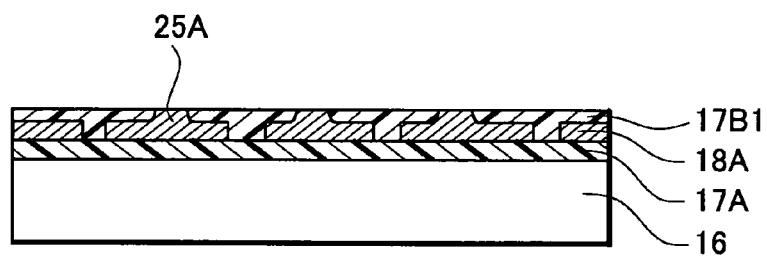
FIGS. 8A to 8C are cross-sectional views showing the method for manufacturing a hybrid integrated circuit device of the preferred embodiment of the present invention.

With reference to FIG. 8A, next, a first resin film 17B1 is formed so as to cover at least a part of the first wiring layer 18A. In order to improve heat release properties, the first resin film 17B1 has a large amount of inorganic fillers mixed therein. An amount of the inorganic fillers contained may be about 80 wt %, for example. In such a case, since resin has a poor fluidity, the first resin film 17B1 may be formed by supplying the resin more than once. Here, the first resin film 17B1 is formed in a manner to expose the upper surface of the first connection part 25A. Moreover, the first resin film 17B1 may be formed in a manner to expose the upper surface of the first connection part 25A including the sides thereof. Furthermore, the first resin film 17B1 may be formed so as to slightly cover the upper surface of the first connection part 25A.

Figure 8B:
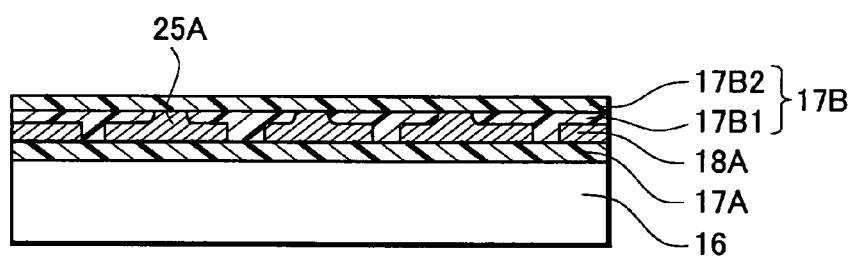

With reference to FIG. 8B, a second resin film 17B2 is formed so as to cover the first resin film 17B1. As described above, the second resin film 17B2 may contain fewer inorganic fillers than the first resin film 17B1. Moreover, an average particle diameter of the inorganic fillers contained in the second resin film 17B2 may be set smaller than that of the inorganic fillers contained in the first resin film 17B1.

Figure 8C:
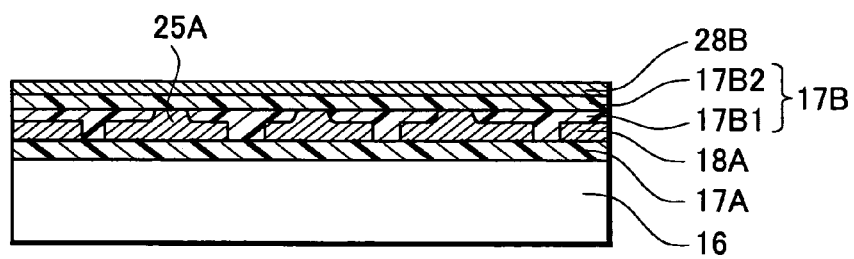

Furthermore, with reference to FIG. 8C, a second conductive film 28B is laminated on the surface of the second resin film 17B2. Here, although the second resin film 17B2 and the second conductive film 28B are formed separately, the second conductive film 28B having the second resin film 17B2 attached to its rear surface may be laminated so as to cover the first resin film 17B1.

With reference to FIGS. 9A to 9D, next, a step of forming a through-hole 32 will be described. Here, the through-hole 32 is formed by partially removing the second conductive film 28B and the second resin film 17B2, which are positioned above the first connection part 25A.

Figure 9A:
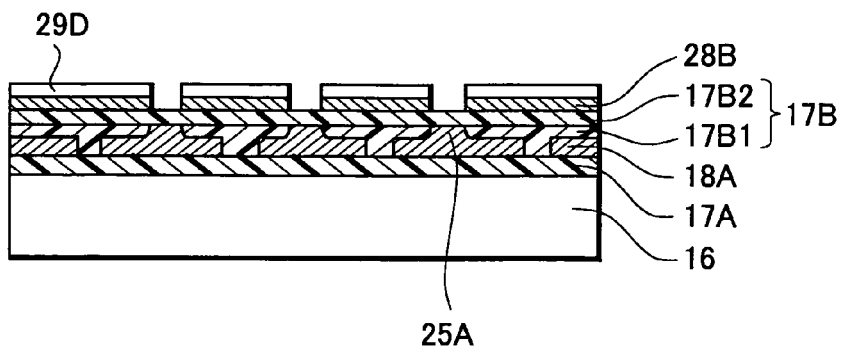
FIGS. 9A to 9D are cross-sectional views showing the method for manufacturing a hybrid integrated circuit device of the preferred embodiment of the present invention.

With reference to FIG. 9A, first, the surface of the second conductive film 28B is covered with a resist 29D while exposing a region where the through-hole 32 will be formed. Thereafter, the second conductive film 28B exposed from the resist 29D is removed by etching. After this etching is performed, the resist 29D is removed.

Figure 9B:
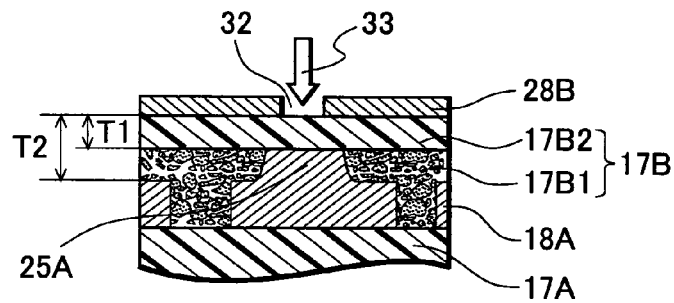

FIG. 9B shows a cross section after the foregoing etching is performed. The second conductive film 28B positioned above the first connection part 25A is removed by the foregoing etching, and the through-hole 32 is formed. The second resin film 17B2 is partially exposed from the bottom of the through-hole 32. Thereafter, by use of the second conductive film 28B as a mask, the second resin film 17B2 is irradiated with a laser. Thus, the first connection part 25A is exposed from the bottom of the through-hole 32.

Here, the second resin film 17B2 covers above the first connection part 25A. The second resin film 17B2 contains fewer inorganic fillers than the first resin film 17B1. Moreover, the average particle diameter of the inorganic fillers contained in the second resin film 17B2 is smaller than that of the inorganic fillers contained in the first resin film 17B1. Therefore, there is an advantage that the through-hole 32 can be relatively easily formed by laser irradiation.

Figure 9C:
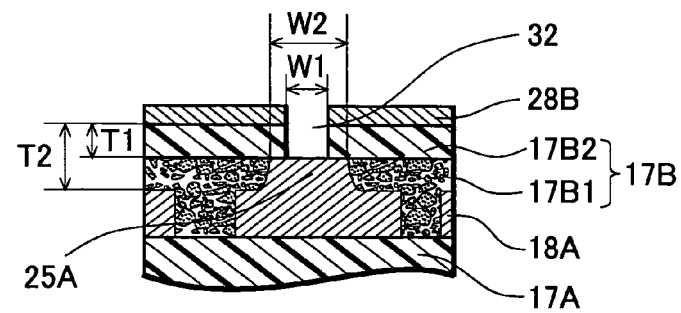

With reference to FIG. 9C, a method for forming the through-hole 32 will be described in more detail. In this embodiment, a second insulating layer 17B in a lower part of the through-hole 32 is thinned by burying the first connection part 25A. Accordingly, the second resin film 17B2 in a thinned region is removed by use of a laser. Thus, the first connection part 25A is exposed in the lower part of the through-hole 32. In most regions, a thickness T2 of the second insulating layer 17B is, for example, about 50 μm. Meanwhile, a thickness T1 of the second resin film 17B2 in the region corresponding to the lower part of the through-hole 32 is, for example, as thin as about 10 μm to 25 μm.

Therefore, if it is assumed that the through-hole 32 having the same aspect ratio is formed by use of the laser, it is possible to form the through-hole 32 having a small diameter according to this embodiment. Under the conditions as described above, the diameter of the through-hole 32 can be reduced to about half. Thus, an area occupied by the through-hole 32 can be reduced to about a quarter. This contributes to miniaturization of the entire device. Moreover, since the inorganic fillers are mixed in the second insulating layer 17B in order to secure the heat release properties, formation of the through-hole 32 by use of the laser is in a somewhat difficult situation. In order to form the through-hole 32 in such a situation, it is significant to reduce the thickness of the second insulating layer 17B in the region where the through-hole 32 is formed.

A planar size of the first connection part 25A is set to be larger than that of the through-hole 32 formed thereabove. In other words, since planar shapes of the through-hole 32 and the first connection part 25A are circles, the diameter of the first connection part 25A is set to be larger than that of the through-hole 32. For example, if a diameter W1 of the through-hole 32 is about 100 μm, a diameter W2 of the first connection part 25A is set to about 150 μm to 200 μm. Moreover, if the diameter W1 of the through-hole 32 is about 30 μm to 50 μm, the diameter W2 of the first connection part 25A is adjusted to about 50 μm to 70 μm. As described above, the planar size of the first connection part 25A is set to be larger than that of the through-hole 32. Accordingly, even if the through-hole 32 is formed with some positional shift, the through-hole 32 can be positioned above the first connection part 25A. Therefore, it is possible to prevent the lowering of connection reliability attributable to the positional shift described above. Moreover, as the planar shape of the first connection part 25A, shapes other than the circle can be adopted.

Figure 9D:
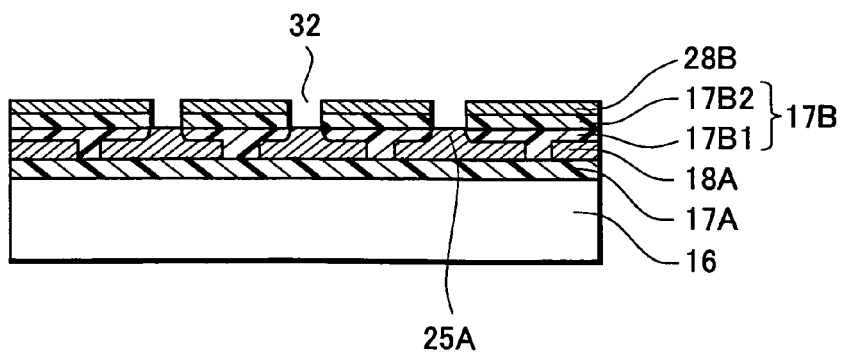

FIG. 9D shows a cross section after the through-hole 32 is formed by use of the foregoing method. From the bottom of each of the through-holes 32, the upper surface of the first connection part 25A is exposed. From the sidewall of the through-hole 32 formed by laser processing, the fillers mixed in the second resin film 17B2 are exposed. As these fillers, $Al_2O_3$, AlN or the like is typically used. Note that, if a residue remains in the bottom of the through-hole 32 after the laser processing described above, cleaning for removing this residue is performed.

Furthermore, in order to perform plating processing in the next step, zincate processing is performed as preparation. In the zincate processing, Zn is attached to a portion where a plated film will be formed by use of an alkaline solution containing Zn ions. Specifically, the sidewall of the through-hole 32 has a portion where the inorganic fillers are exposed. Moreover, if fillers are mixed in the second resin film 17B2, a large portion of the sidewall of the through-hole 32 becomes a surface where the fillers are exposed. On the surface of inorganic fillers such as ceramic, it is difficult to form an electroless plated film having a sufficient adhesion and the like. Accordingly, in this embodiment, after a metal film made of Zn is formed on the surface of the through-hole 32 on which the inorganic fillers are exposed, a plated film 34 is formed by a substitution reaction with Zn. Therefore, adhesion strength between the sidewall of the through-hole 32 and the plated film 34 is secured.

With reference to FIGS. 10 and 11, next, a description will be given of a step of forming a second connection part 25B by forming a plated film in the through-hole 32 and of connecting the first wiring layer 18A and the second conductive film 28B. There are considered two methods for forming the plated film. The first method is a method for forming a plated film by electroless plating and, thereafter, forming a plated film again by electrolytic plating. The second method is a method for forming a plated film only by electrolytic plating.

Figure 10A:
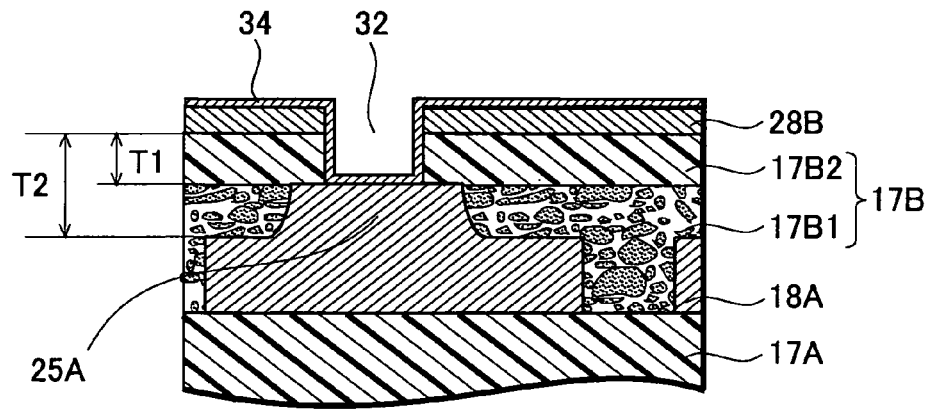
FIGS. 10A to 10C are cross-sectional views showing the method for manufacturing a hybrid integrated circuit device of the preferred embodiment of the present invention.
Figure 10B:
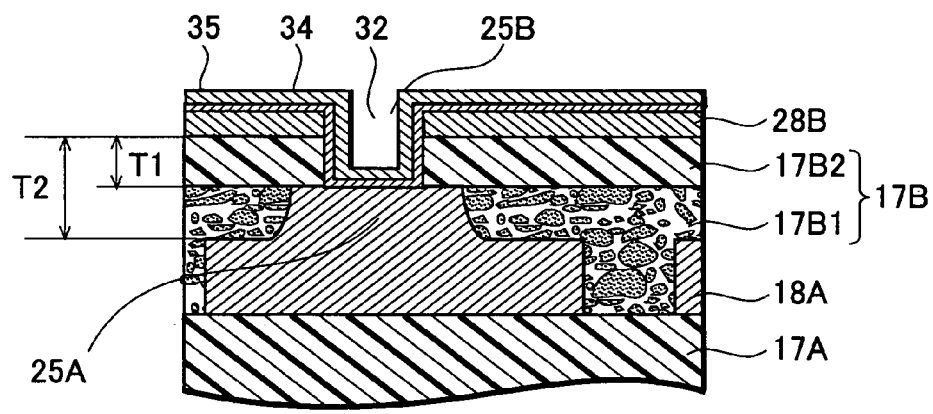
Figure 10C:
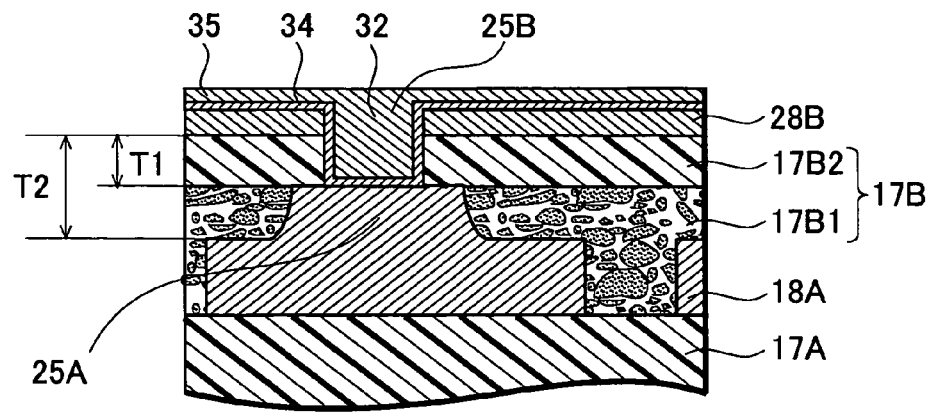

With reference to FIGS. 10A to 10C, the foregoing first method for forming a plated film will be described. First, with reference to FIG. 10A, the plated film 34 is formed by electroless plating on the surface of the second conductive film 28B including the sidewall of the through-hole 32. A thickness of the plated film 34 may be about 3 μm to 5 μm.

Next, with reference to FIG. 10B, a new plated film 35 is formed on the plated film 34 by electrolytic plating. To be more specific, by use of the second conductive film 28B having the plated film 34 formed thereon as a cathode electrode, the plated film 35 is formed by electrolytic plating. By the electroless plating described above, the plated film 34 is formed on an inner wall of the through-hole 32. Therefore, the plated film 35 formed here is formed to have a uniform thickness including the inner wall of the through-hole 32. Thus, the second connection part 25B formed of the plated film is formed. Specifically, a thickness of the plated film 35 is, for example, about 20 μm. As a material of the plated films 34 and 35 described above, copper that is the same material as that of the second conductive film 28B can be used. Moreover, metal other than copper can be used as the material of the plated films 34 and 35.

With reference to FIG. 10C, here, filling plating is performed to fill the through-hole 32 with the plated film 35. By performing the filling plating, mechanical strength of the second connection part 25B can be improved.

Next, with reference to FIGS. 11A and 11B, a description will be given of a method for forming the second connection part 25B by electrolytic plating.

Figure 11A:
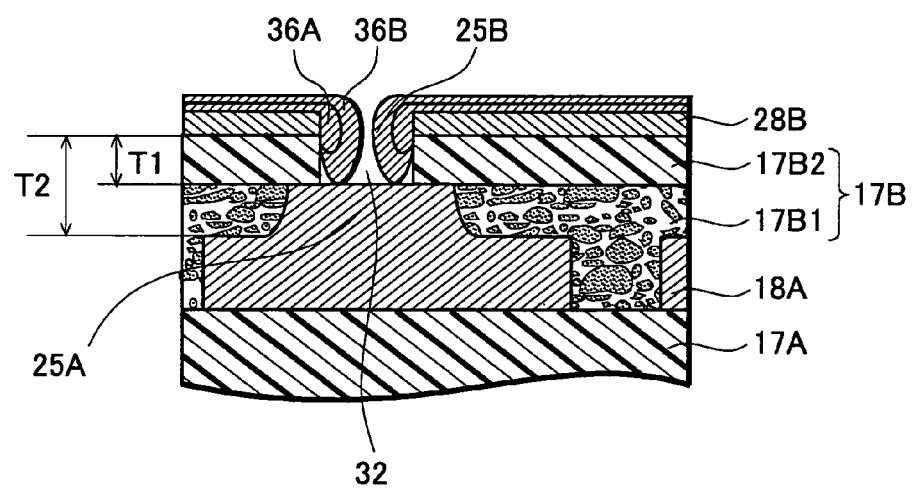
FIGS. 11A and 11B are cross-sectional views showing the method for manufacturing a hybrid integrated circuit device of the preferred embodiment of the present invention.

With reference to FIG. 11A, first, a solution containing metal ions is allowed to come into contact with the through-hole 32. Here, as a material of a plated film, copper, gold, silver, palladium or the like can be used. When a current is allowed to flow by use of the second conductive film 28B as the cathode electrode, metal is deposited on the second conductive film 28B that is the cathode electrode, and a plated film is formed. Here, reference numerals 36A and 36B indicate a state where the plated film is grown. By electrolytic plating, a plated film is preferentially formed in a spot with a strong electric field. In this embodiment, this electric field becomes stronger in the second conductive film 28B in a portion which faces the peripheral portion of the through-hole 32. Therefore, as shown in FIG. 11A, the plated film is preferentially grown from the second conductive film 28B in a portion which faces the peripheral portion of the through-hole 32. At the point when the formed plated film comes into contact with the first connection part 25A, the first wiring layer 18A and the second conductive film 28B are connected to each other. Thereafter, a plated film is formed uniformly inside the through-hole 32. Thus, inside the through-hole 32, the second connection part 25B integrated with the second conductive film 28B is formed.

Figure 11B:
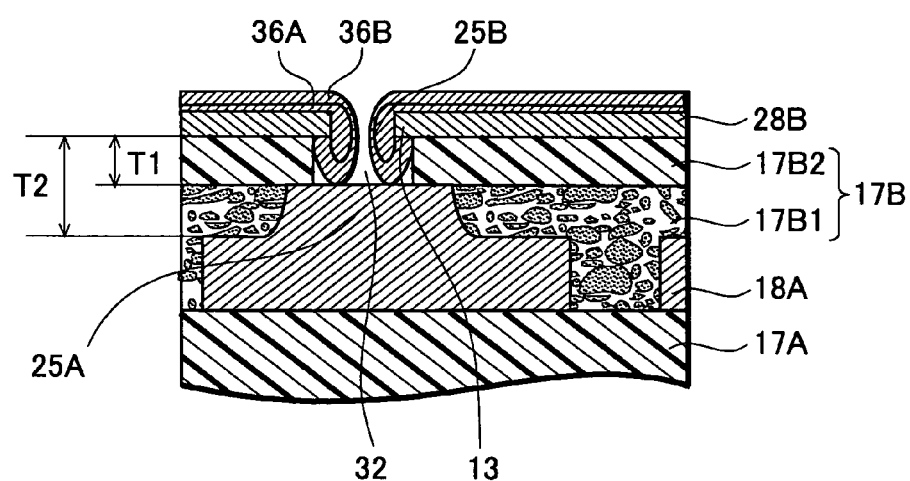

With reference to FIG. 11B, next, a description will be given of another method for forming the second connection part 25B. Here, a canopy top 13 is provided in a peripheral portion of the through-hole 32. Thus, the second connection part 25B is easily formed by electrolytic plating. Here, the "canopy top" means a part which is formed of the second conductive film 28B and is protruded so as to cover the peripheral portion of the through-hole 32. A specific method for forming the canopy top 13 can be performed by increasing output of a laser when the through-hole 32 is formed by use of the laser. By increasing the output of the laser, removal of the second resin film 17B2 by use of the laser is advanced horizontally, and the resin below the canopy top 13 is removed. Under the conditions described above, electrolytic plating is performed by use of the second conductive film 28B as the cathode electrode. Accordingly, the plated film is grown preferentially from the canopy top 13. Since the plated film is grown from the canopy top 13, the plated film can be grown preferentially downward compared to the case of FIG. 11A. Therefore, it is possible to surely fill the through-hole 32 with the plated film.

The sidewall of the through-hole 32 of this embodiment has irregularities. Moreover, the inorganic fillers mixed in the second insulating layer 17B are exposed on the sidewall of the through-hole 32. Accordingly, it is difficult to form a plated film on the sidewall of the through-hole 32. Generally, a plated film is hardly attached to the surface of inorganic fillers. Particularly, if AlN is exposed on the sidewall of the through-hole 32, it is difficult to form a plated film. Thus, in this embodiment, the second connection part 25B is formed by use of a method using the electrolytic plating described above.

Furthermore, in this embodiment, by forming a plated film in the through-hole 32, a plated film is inevitably formed on the surface of the second conductive film 28B, and a thickness thereof is increased. However, in this embodiment, since the plated film is formed in the through-hole 32 which is as shallow as about 10 μm as described above, a total thickness of the plated films formed can be reduced. Therefore, since there is a small increase in the thickness of the second conductive film 28B due to adhesion of the plated film, the second conductive film 28B can be maintained to be thin. Thus, the second wiring layer 18B formed of the second conductive film 28B can be made minute.

Furthermore, also in the case where the through-hole 32 is filled up by filling plating, since the through-hole 32 is formed to be shallow as described above, filling plating can be easily performed.

Figure 12A:
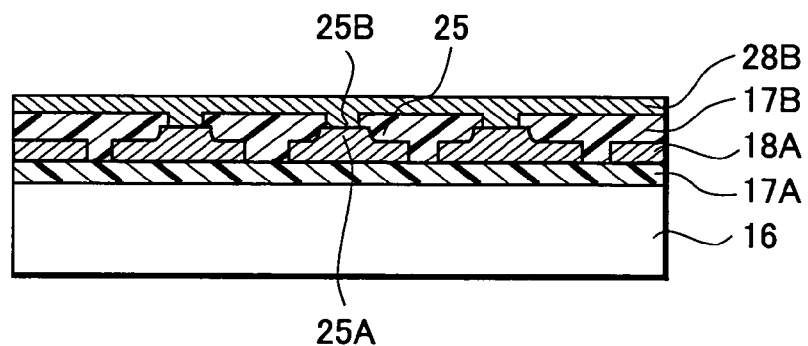
FIGS. 12A to 12C are cross-sectional views showing the method for manufacturing a hybrid integrated circuit device of the preferred embodiment of the present invention.
Figure 12B:
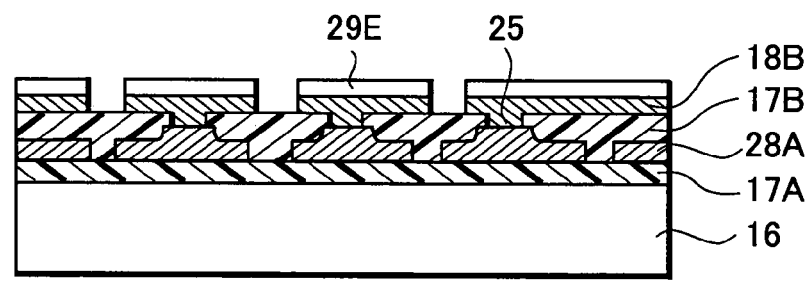
Figure 12C:
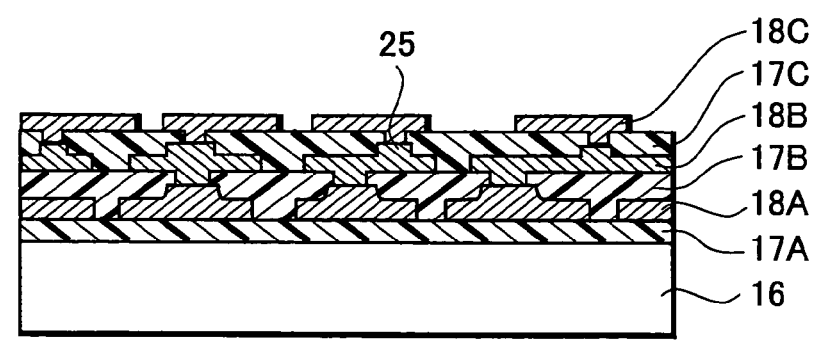

With reference to FIG. 12A, by forming the second connection part 25B, a connection part 25 including the first and second connection parts 25A and 25B is formed. Moreover, with reference to FIG. 12B, by performing selective etching using a resist 29E, a second wiring layer 18B is formed. Furthermore, with reference to FIG. 12C, here, a three-layer wiring structure including the first to a third wiring layers 18A to 18C is formed. In this case, the connection parts 25 protruded in a convex shape are formed on both the upper and lower surfaces of the second wiring layer 18B.

Figure 13A:
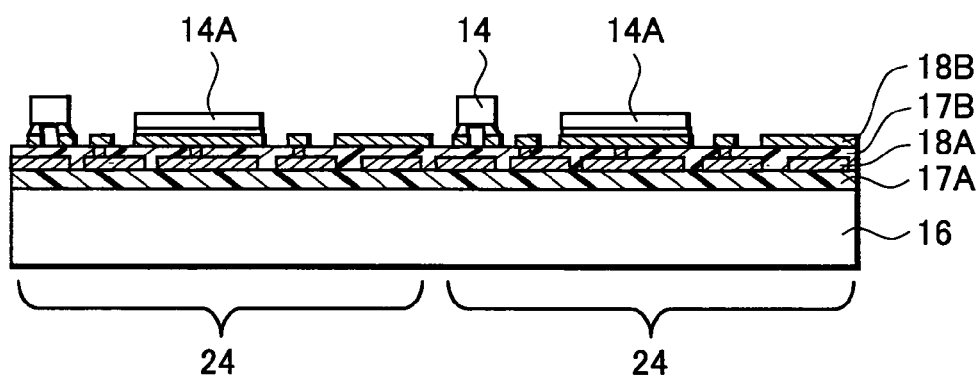
FIGS. 13A and 13B are cross-sectional views showing the method for manufacturing a hybrid integrated circuit device of the preferred embodiment of the present invention.
Figure 13B:
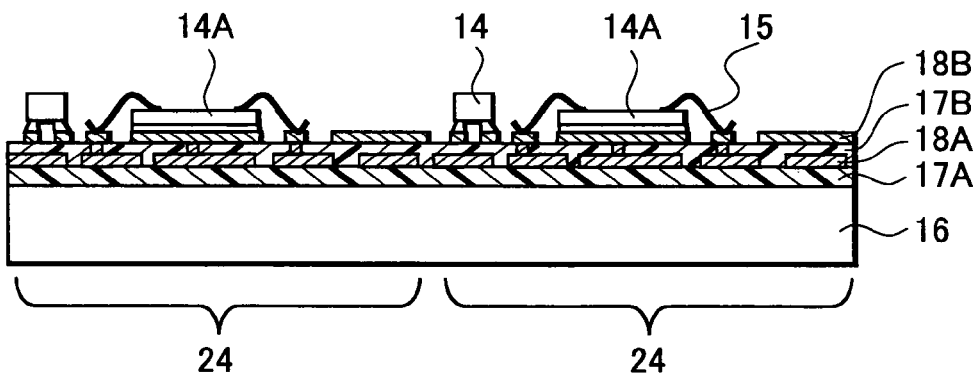

With reference to FIG. 13A, next, a circuit element 14 is fixed onto the second wiring layer 18B (island) by use of solder, a conductive paste or the like. Although, here, an active element is mounted face up, the element may be mounted face down if needed. Moreover, with reference to FIG. 13B, a semiconductor element 14A and the second wiring layer 18B are electrically connected to each other through thin metal wires 15.

After the foregoing steps are finished, an each unit 24 is separated. The units 24 can be separated by punching using a press machine, dicing, bending or the like. Thereafter, leads 11 are fixed to the circuit board 16 of each unit 24.

Figure 14:
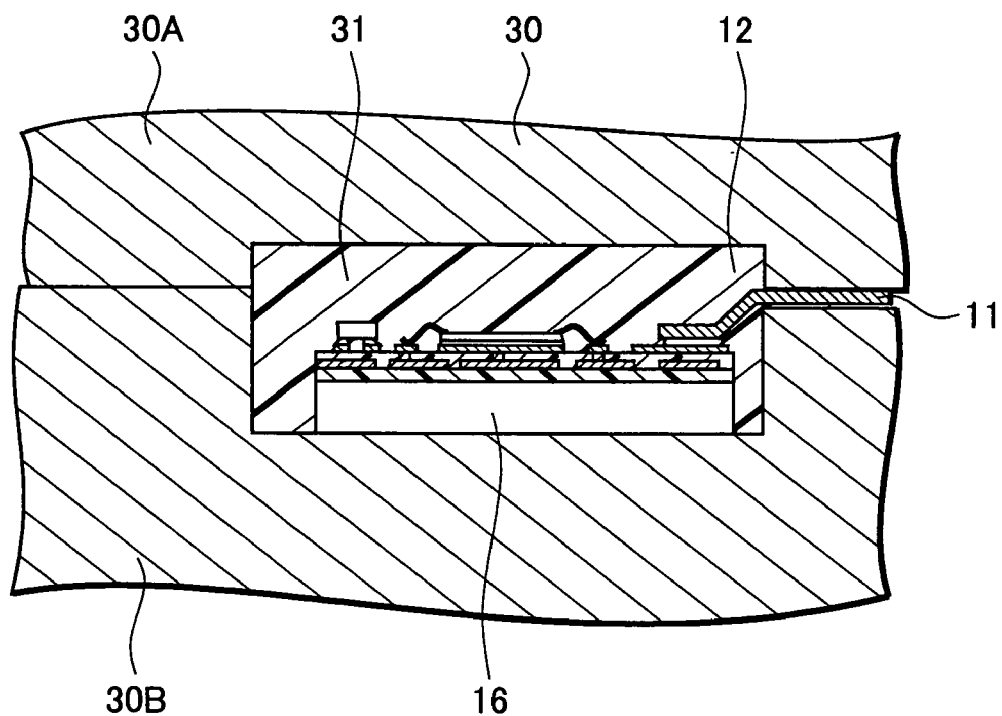
FIG. 14 is a cross-sectional view showing the method for manufacturing a hybrid integrated circuit device of the preferred embodiment of the present invention.

With reference to FIG. 14, next, resin sealing of the each circuit board 16 is performed. Here, sealing is performed by transfer molding using a thermosetting resin. Specifically, after the circuit board 16 is housed in a mold 30 formed of an upper mold 30A and a lower mold 30B, the both molds are engaged with each other to fix the leads 11. Subsequently, the resin is injected into a cavity 31, and the resin sealing step is performed. By the steps described above, the hybrid integrated circuit device having the structure shown in FIGS. 1A to 1C, for example, is manufactured.

Third Embodiment

Figure 15A:
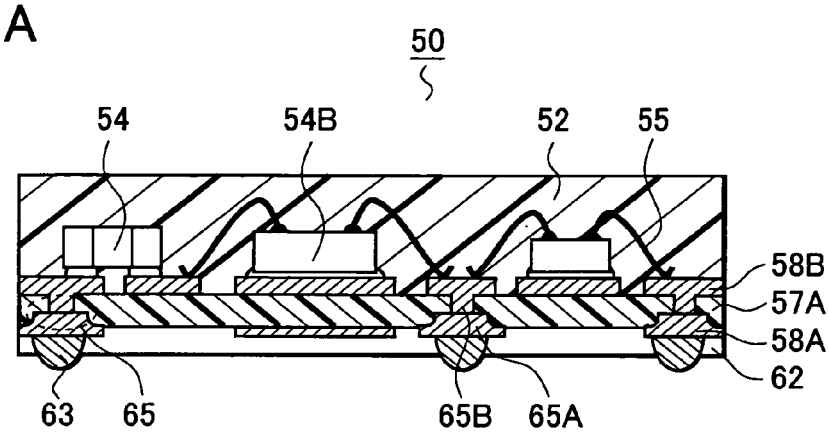
FIGS. 15A to 15C are cross-sectional views showing a circuit device of the preferred embodiment of the present invention.
Figure 15B:
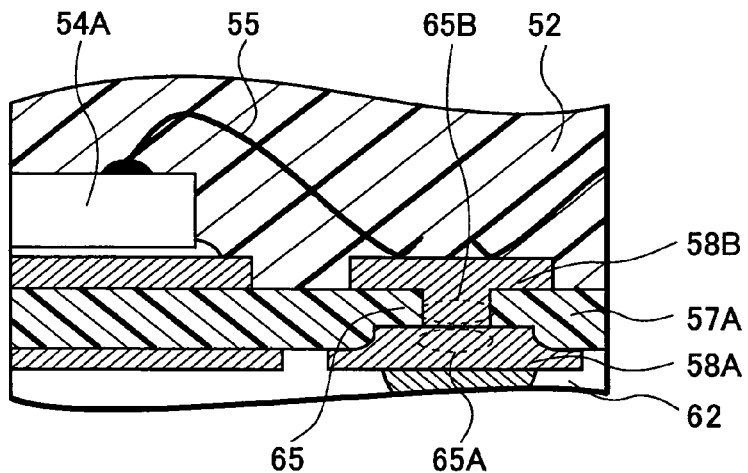
Figure 15C:
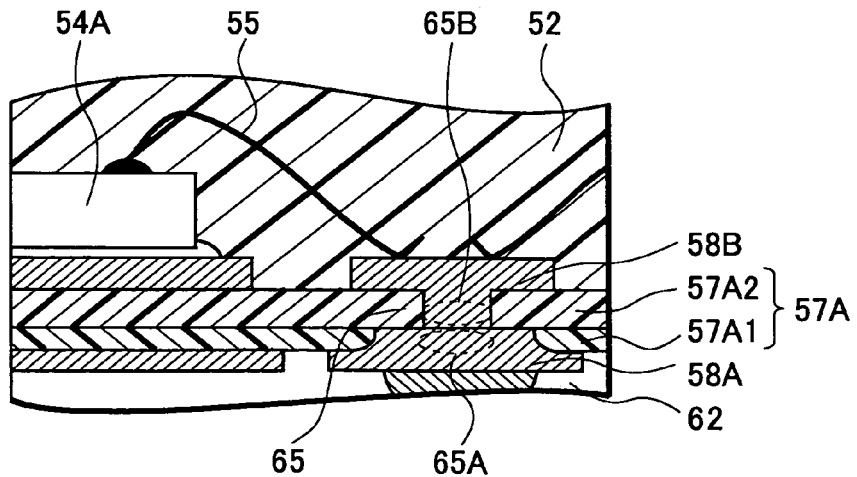

In this embodiment, a description will be given of a circuit device as shown in FIGS. 15A to 15C and the like as an example of a circuit device.

With reference to FIGS. 15A to 15C, a circuit device 50 of this embodiment will be described. FIG. 15A is a cross-sectional view of the circuit device 50, and FIG. 15B is an enlarged cross-sectional view of a connection part 65 and the vicinity thereof in the circuit device 50. FIG. 15C is an enlarged cross-sectional view of the connection part 65 for showing a cross-sectional configuration of another configuration.

With reference to FIG. 15A, in the circuit device 50 of this embodiment, a multilayer wiring structure is formed, which includes a first wiring layer 58A and a second wiring layer 58B. The first and the second wiring layers 58A and 58B are laminated with each other with a first insulating layer 57A interposed therebetween. The upper second wiring layer 58B is electrically connected to a circuit element 54. An external electrode 63 is formed on the rear surface of the first wiring layer 58A positioned in the lower layer. Furthermore, the surfaces of the circuit element 54 and the second wiring layer 58B are covered with a sealing resin 52. The circuit device 50 having such a configuration will be described in detail below.

The first wiring layer 58A is made of metal such as copper, and is patterned, as the lowest wiring layer, on the rear surface of the first insulating layer 57A. This first wiring layer 58A is electrically connected to the second wiring layer 58B positioned in the upper layer. In addition, the first wiring layer 58A may function as a pad for forming the external electrode 63. Moreover, the first wiring layer 58A itself may be used as the external electrode. Furthermore, the first wiring layer 58A may form a wiring part which intersects with the second wiring layer 58B positioned in the upper layer.

The second wiring layer 58B is the upper wiring layer, and is formed on the surface of the first insulating layer 57A. The second wiring layer 58B forms a land on which the circuit element 54 is mounted, pads connected to electrodes on the circuit element, and a wiring part which electrically connects the pads to each other. Moreover, the second wiring layer 58B and the first wiring layer 58A can be formed so as to planarly intersect with each other. Therefore, even if a semiconductor element 54A has a number of electrodes, the multilayer wiring structure of the present application enables a crossover and makes it possible to freely extend a pattern. The second wiring layer 58B and the first wiring layer 58A described above are connected to each other in desired spots through the connection part 65. It is needless to say that, in accordance with the number of electrodes of the semiconductor element, a packaging density of elements, and the like, 3, 4, 5 or more of wiring layers can also be provided.

The first insulating layer 57A is formed in a manner to attach the first and the second wiring layers 58A and 58B to each other to be sheet-shaped. In the first insulating layer 57A, the connection part 65 which electrically connects the first and second wiring layers 58A and 58B to each other is formed in a manner to penetrate the layer. Therefore, in order to easily form the connection part 65, the first insulating layer 57A may have a small amount of fillers mixed therein. Moreover, for the same reason, an average particle diameter of the fillers contained in the first insulating layer 57A may be small.

The connection part 65 is a part which penetrates the first insulating layer 57A and electrically connects the first wiring layer 58A and the second wiring layer 58B. In this embodiment, the connection part 65 is formed of a first connection part 65A extended continuously from the first wiring layer 58A, and a second connection part 65B extended continuously from the second wiring layer 58B. More details about the connection part 65 will be described later with reference to FIGS. 15B and 15C.

The circuit element 54 is fixed onto the second wiring layer 58B, and the circuit element 54 and a wiring layer 58 form a predetermined electric circuit. As the circuit element 54, an active element such as a transistor, a diode, an IC, and a system LSI or a passive element such as a condenser and a resistor is adopted.

The sealing resin 52 is formed by transfer molding using a thermosetting resin or by injection molding using a thermoplastic resin. Here, the sealing resin 52 is formed so as to seal the electric circuit including the second wiring layer 58B, the semiconductor element 54A, and the circuit element 54. Moreover, as a sealing method other than sealing by molding, for example, well-known sealing methods such as sealing by potting can be applied.

The external electrode 63 is made of a brazing material such as solder, is formed in a predetermined position on the rear surface of the first wiring layer 58A, and functions as connection means in fixing the circuit device 50 to a mounting board. Moreover, the external electrode 63 also has a function of exchanging electric signals with the outside, and a function of releasing heat to the outside.

With reference to the cross-sectional view of FIG. 15B, the connection part 65 will be described in detail. FIG. 15B is an enlarged cross-sectional view of the circuit device 50, showing the connection part 65 and the vicinity thereof. The connection part 65 is a part which connects the laminated wiring layers 58 to each other through a insulating layer 57. Moreover, the connection part 65 can also be used as a thermal via for thermally connecting the wiring layers 58 to each other.

In this embodiment, the connection part 65 including the first connection part 65A and the second connection part 65B is formed. The first connection part 65A is a part protruded continuously from the first wiring layer 58A in its thickness direction. Here, the first connection part 65A is protruded upward and buried in the first insulating layer 57A. The second connection part 65B is a part protruded continuously from the second wiring layer 58B in its thickness direction. Here, the second connection part 65B is protruded downward and buried in the first insulating layer 57A.

The first connection part 65A is formed by etching processing in a manner to be protruded in the thickness direction, and is made of a Cu foil formed by plating or calendering. Moreover, the first connection part 65A can also be formed by use of a method other than etching processing. To be more specific, by depositing an electrolytic plated film or an electroless plated film so as to form a convex shape on the surface of the first wiring layer 58A, the first connection part 65A can be formed. Moreover, it is also possible to form the first connection part 65A by providing a conductive material such as a brazing material including solder and the like, and silver paste on the surface of the first wiring layer 58A.

The second connection part 65B is a part formed by plating processing such as electrolytic plating and electroless plating. A method for forming the second connection part 65B will be described later in an embodiment for explaining a manufacturing method. Moreover, the second connection part 65B can also be formed by use of the other methods for forming the first connection part 65A described above.

In this embodiment, a spot where the above-described the first and the second connection parts 65A and 65B come into contact with each other is positioned in the intermediate portion of the first insulating layer 57A in its thickness direction. Here, the intermediate portion means a portion that is above the upper surface of the first wiring layer 58A and is below the lower surface of the second wiring layer 58B. Therefore, although the spot where the first and the second connection parts 65A and 65B come into contact with each other is around the center portion of the first insulating layer 57A in its thickness direction on the page space, the spot can be changed within a range of the intermediate portion described above. Considering the case where the second connection part 65B is formed by plating processing, the portion where the first and the second connection parts 65A and 65B come into contact with each other is preferably disposed above the intermediate position between the upper surface of the first wiring layer 58A and the lower surface of the second wiring layer 58B. Thus, there is an advantage that formation of the second connection part 65B made of the plated film is facilitated. Specifically, as is made clear by the manufacturing method to be described later, a via is formed to form the second connection part, and a depth of this via can be reduced. Moreover, as the via is formed to be shallow, a diameter of the via can be reduced. Furthermore, as the diameter of the via is reduced, an interval is narrowed, and an entire minute pattern can be realized.

With reference to FIG. 15C, a description will be given of a cross section of a circuit device of another configuration. Here, the first insulating layer 57A positioned between the each wiring layer 58 is formed of a first resin film 57A1 and a second resin film 57A2. The first resin film 57A1 is made of an insulating resin containing inorganic fillers, and covers the first wiring layer 58A including the surface of the first connection part 65A. Here, the first resin film 57A1 is formed so as to cover the first wiring layer 58A in a portion lower than the upper surface of the first connection part 65A. The second resin film 57A2 is formed so as to cover the upper surface of the first resin film 57A1 described above. The second resin film 57A2 is made of a resin containing fewer inorganic fillers than the first resin film 57A1. Moreover, an average particle diameter of the inorganic fillers contained in the second resin film 57A2 may be set smaller than that of the inorganic fillers contained in the first resin film 57A1. Alternatively, a resin containing no fillers may be used as the second resin film 57A2. Thus, there is an advantage that a through-hole is easily formed in the second resin film 57A2. Furthermore, there is also an advantage that a plated film is easily formed in the through-hole formed.

Figure 16A:
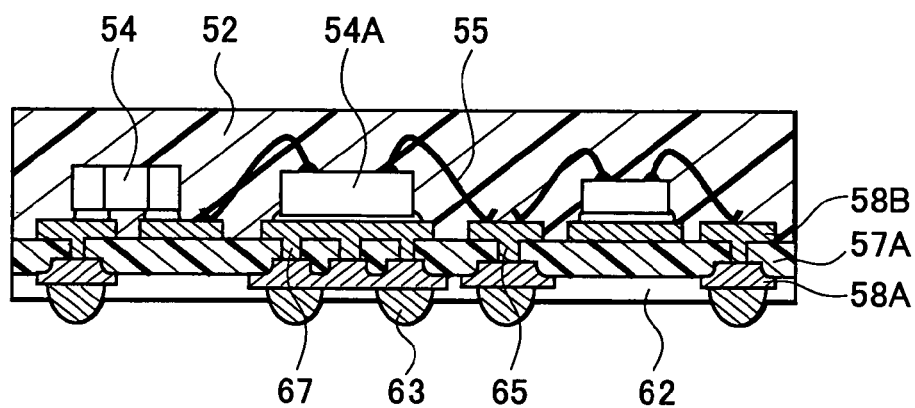
FIGS. 16A and 16B are cross-sectional views showing the circuit device of the preferred embodiment of the present invention.
Figure 16B:
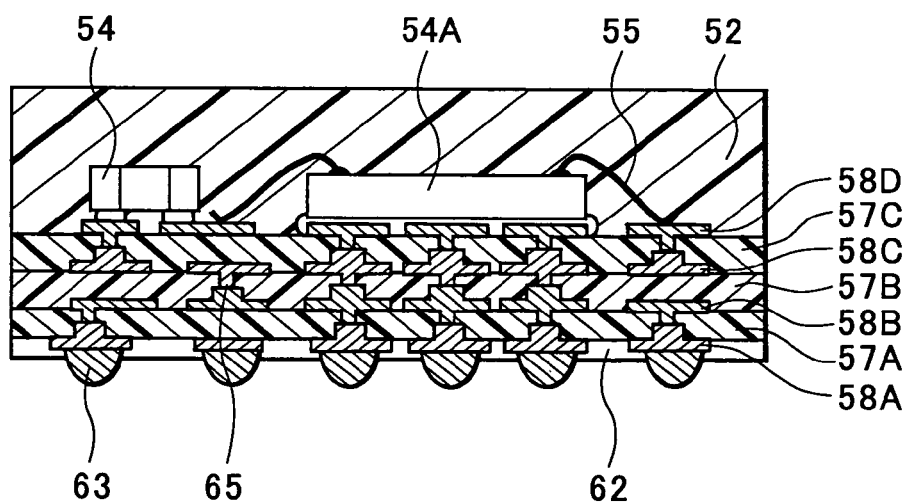

With reference to FIGS. 16A and 16B, a configuration of a circuit device of another configuration will be described. FIGS. 16A and 16B are cross-sectional views of the circuit device of the configuration.

With reference to FIG. 16A, here, a thermal via 67 is formed in a manner to penetrate the first insulating layer 57A. The thermal via 67 is a part formed by filling a hole penetrating the first insulating layer 57A with metal, and functions as a path of heat to the outside. Therefore, the thermal via 67 may not function as an electrical path. To be more specific, the thermal via 67 is formed in a manner to come into contact with the lower surface of the land-shaped second wiring layer 58B to which the semiconductor element 54A is fixed. Therefore, even if a large amount of heat is generated from the semiconductor element 54A, the heat is transmitted to the outside through the plurality of thermal vias 67. In this case, a path of the heat is from the semiconductor element 54A to the outside through the second wiring layer 58B, the thermal via 67, and the external electrode 63. Here, the thermal via 67 is formed of the first and the second connection parts 65A and 65B described above. In addition, a portion where the first and the second connection parts 65A and 65B come into contact with each other is the intermediate portion of the insulating layer in its thickness direction. The thermal via 67 functions as the path of heat, and is a part on which a large thermal stress is expected to act. Thus, the configuration of this configuration is significant.

With reference to FIG. 16B, here, a four-layer wiring structure is formed by the laminating wiring layers 58 with the insulating layers 57 interposed therebetween. To be more specific, the first wiring layer 58A is formed on the lower surface of the first insulating layer 57A. Thereafter, the second wiring layer 58B is formed on the first insulating layer 57A. Accordingly, the second to a fourth wiring layers 58B to 58D are laminated with the first to a third insulating layers 57A to 57C interposed therebetween. Therefore, by increasing the number of the wiring layers 58, a wiring density can be improved. In the first to the third insulating layers 57A to 57C, the connection parts 65 are formed to connect the wiring layers to each other. Here, the external electrodes 63 are formed in predetermined spots of the first wiring layer 58A. Moreover, external electrodes 63 which are formed immediately below the semiconductor element 54A can be utilized only for improving heat release properties. Specifically, electric signals are not exchanged through the external electrodes 63.

Fourth Embodiment

In this embodiment, a description will be given of a method for manufacturing a circuit device 50 described above as an example.

Figure 17A:
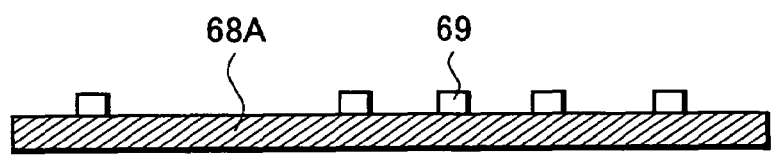
FIGS. 17A to 17C are cross-sectional views showing a method for manufacturing a circuit device of the preferred embodiment of the present invention.

First, with reference to FIG. 17A, a first conductive film 68A is prepared. As the first conductive film 68A, a material mainly made of copper or a material mainly made of Fe—Ni or Al can be used. For a thickness of the first conductive film 68A, more than a thickness obtained by adding a thickness of a wiring layer 58 to be formed and a height of a first connection part 65A is required. To be more specific, the thickness of the first conductive film 68A is, for example, about 20 μm to 150 μm. A resist 69 covers the surface of the first conductive film 68A in a region where the first connection part 65A will be formed. In a state where the resist 69 covers the surface, etching is performed.

Figure 17B:
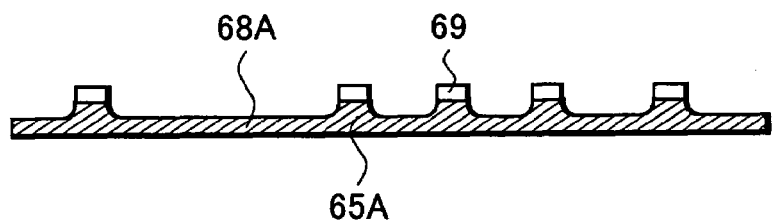

FIG. 17B shows a cross section in a state after etching is performed. Here, the region covered with the resist 69 is protruded in a convex shape. The portion protruded in the convex shape forms the first connection part 65A. The first conductive film 68A in the region where etching is performed with the surface exposed is formed to be uniformly thin. After this step is finished, the resist 69 is removed. Here, a height of protrusion of the first connection part 65A is adjusted to about several dozen μm.

Figure 17C:
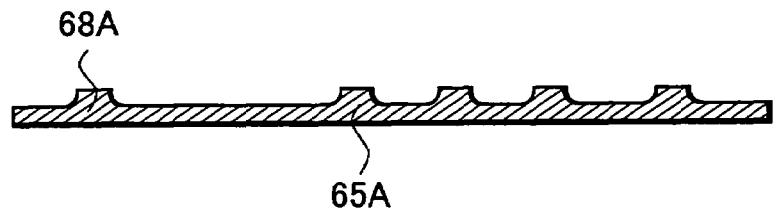

FIG. 17C shows the first connection part 65A in the state where the resist 69 is removed.

Next, with reference to FIGS. 18A to 18C, a description will be given of another method for forming the first connection part 65A on the surface of the first conductive film 68A. Here, the first connection part 65A is formed by selectively forming a plated film on the surface of the first conductive film 68A.

Figure 18A:
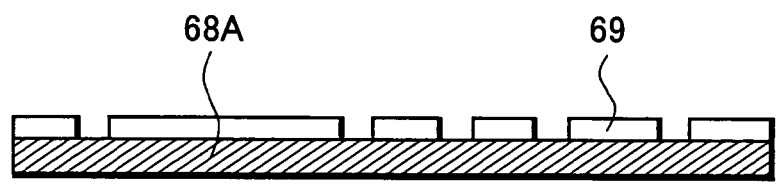
FIGS. 18A to 18C are cross-sectional views showing the method for manufacturing a circuit device of the preferred embodiment of the present invention.

With reference to FIG. 18A, first, the resist 69 is selectively formed on the surface of the first conductive film 68A. To be more specific, the resist 69 is formed on the surface except for a region where the first connection part 65A will be formed.

Figure 18B:
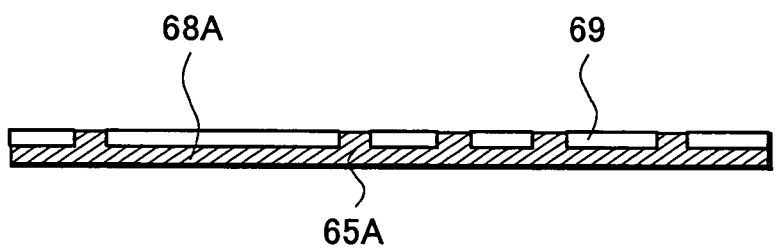
Figure 18C:
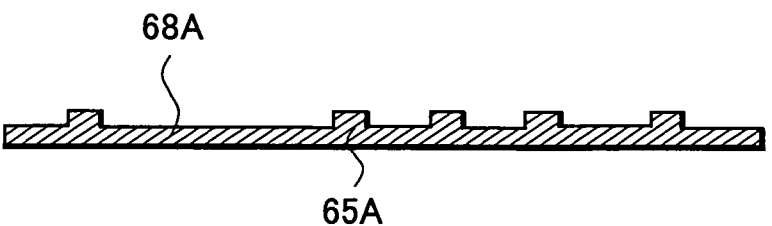

Next, with reference to FIG. 18B, a plated film is grown on the surface of the first conductive film 68A which is selectively exposed from the resist 69. For formation of the plated film, electrolytic plating, electroless plating or a method combining the both can be adopted. After this step is finished, the resist 69 is removed, and the first connection part 65A having a convex shape as shown in FIG. 18C is obtained.

Figure 19A:
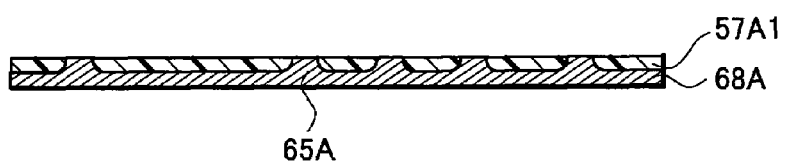
FIGS. 19A to 19C are cross-sectional views showing the method for manufacturing a circuit device of the preferred embodiment of the present invention.

With reference to FIG. 19A, next, a first resin film 57A1 is formed so as to cover at least a part of the first conductive film 68A. In order to improve heat release properties, the first resin film 57A1 may have a large amount of inorganic fillers mixed therein. An amount of the inorganic fillers contained may be about 80 wt %, for example. In such a case, since resin has a poor fluidity, the first resin film 57A1 may be formed by supplying the resin more than once. Here, the first resin film 57A1 is formed in a manner to expose the upper surface of the first connection part 65A. Moreover, the first resin film 57A1 may be formed so as to slightly cover the upper surface of the first connection part 65A.

Figure 19B:
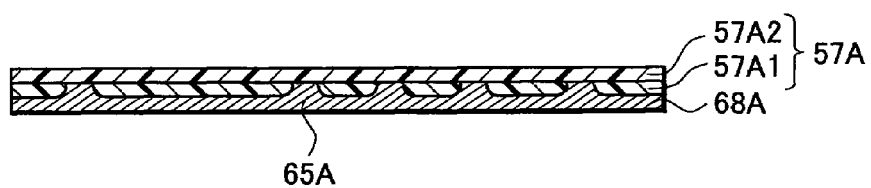

With reference to FIG. 19B, a second resin film 57A2 is formed so as to cover the first resin film 57A1. As described above, the second resin film 57A2 may contain fewer inorganic fillers than the first resin film 57A1. Alternatively, a resin containing no fillers may be used as the second resin film 57A2. Moreover, an average particle diameter of the inorganic fillers contained in the second resin film 57A2 may be set smaller than that of the inorganic fillers contained in the first resin film 57A1.

Figure 19C:
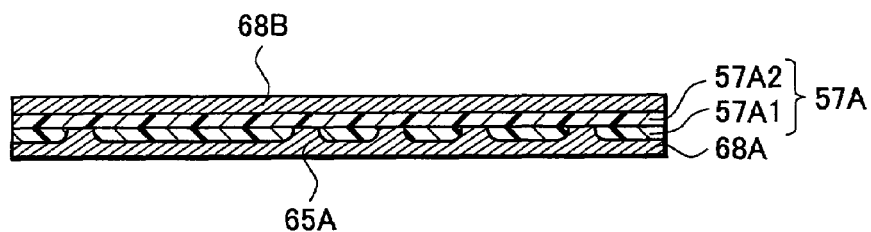

Furthermore, with reference to FIG. 19C, a second conductive film 68B is laminated on the surface of the second resin film 57A2. Here, although the second resin film 57A2 and the second conductive film 68B are separately formed, the second conductive film 68B having the second resin film 57A2 attached to its rear surface may be laminated so as to cover the first resin film 57A1.

With reference to FIGS. 20A to 20D, next, a step of forming a through-hole 72 will be described. Here, the through-hole 72 is formed by partially removing the second conductive film 68B and the second resin film 57A2, which are positioned above the first connection part 65A.

Figure 20A:
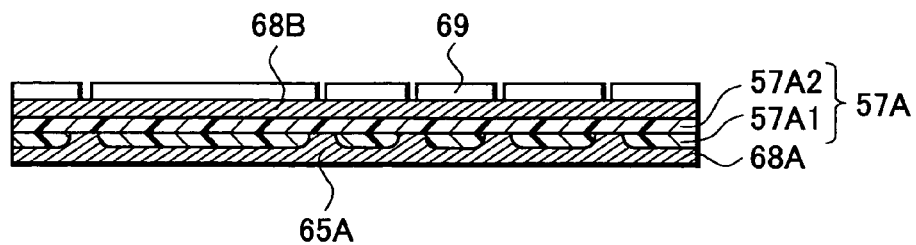
FIGS. 20A to 20D are cross-sectional views showing the method for manufacturing a circuit device of the preferred embodiment of the present invention.

With reference to FIG. 20A, first, the surface of the second conductive film 68B is covered with the resist 69 while exposing a region where the through-hole 72 will be formed. Thereafter, the region where the second conductive film 68B is exposed from the resist 69 is removed by etching. After this etching is performed, the resist 69 is removed.

Figure 20B:
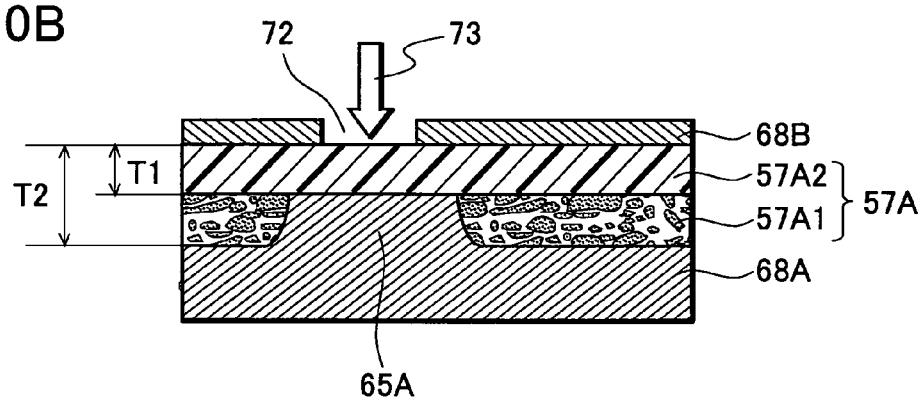

FIG. 20B shows a cross section after the foregoing etching is performed. The second conductive film 68B positioned above the first connection part 65A is removed by the foregoing etching, and the through-hole 72 is formed. The second resin film 57A2 is partially exposed from the bottom of the through-hole 72. Thereafter, by use of the second conductive film 68B as a mask, the second resin film 57A2 is irradiated with a laser 73. Thus, the first connection part 65A is exposed from the bottom of the through-hole 72.

Here, the second resin film 57A2 covers above the first connection part 65A. The second resin film 57A2 contains fewer inorganic fillers than the first resin film 57A1. Moreover, the average particle diameter of the inorganic fillers contained in the second resin film 57A2 is smaller than that of the inorganic fillers contained in the first resin film 57A1. Therefore, there is an advantage that the through-hole 72 can be relatively easily formed by laser irradiation.

Figure 20C:
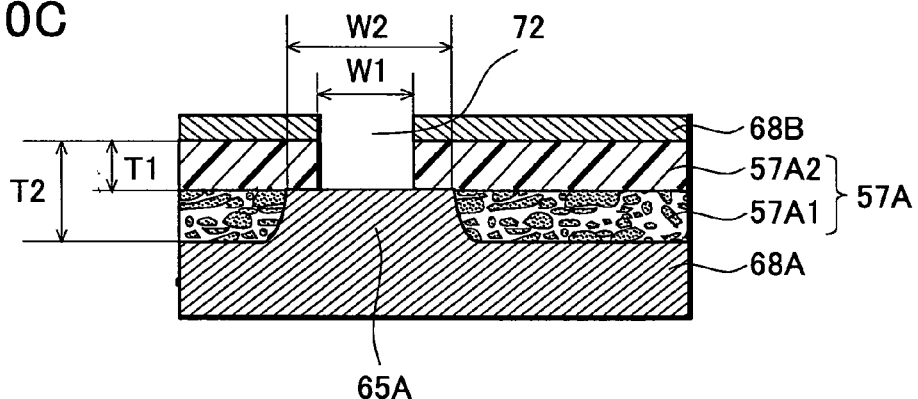

With reference to FIG. 20C, a method for forming the through-hole 72 will be described in more detail. In this embodiment, a first insulating layer 57A in a lower part of the through-hole 72 is thinned by burying the first connection part 65A. Accordingly, the second resin film 57A2 in a thinned region is removed by use of a laser. Thus, the first connection part 65A is exposed in the lower part of the through-hole 72. In most regions, a thickness T2 of the first insulating layer 57A is, for example, about 50 μm. Meanwhile, a thickness T1 of the second resin film 57A2 in the region corresponding to the lower part of the through-hole 72 is, for example, as thin as about 10 μm to 25 μm.

Therefore, if it is assumed that the through-hole 72 having the same aspect ratio is formed by use of the laser, it is possible to form the through-hole 72 having a small diameter according to this embodiment. Under the conditions as described above, the diameter of the through-hole 72 can be reduced to about half. Thus, an area occupied by the through-hole 72 can be reduced to about a quarter. This contributes to miniaturization of the entire device. Moreover, since the inorganic fillers are mixed in the first insulating layer 57A in order to secure the heat release properties, formation of the through-hole 72 by use of the laser is in a somewhat difficult situation. In order to form the through-hole 72 in such a situation, it is significant to reduce the thickness of the first insulating layer 57A in the region where the through-hole 72 is formed.

Figure 20D:
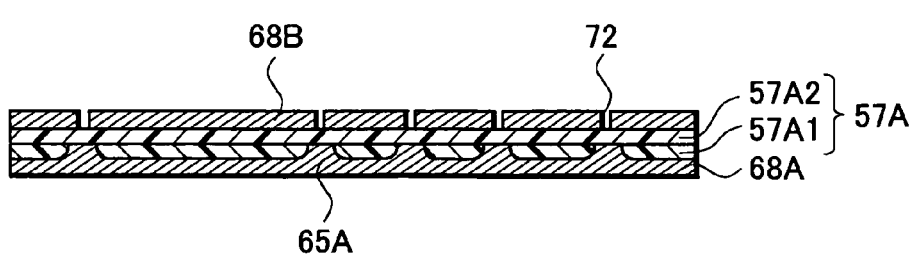

FIG. 20D shows a cross section after the through-hole 72 is formed by use of the foregoing method. From the bottom of each of the through-holes 72, the upper surface of the first connection part 65A is exposed. From the sidewall of the through-hole 72 formed by laser processing, the fillers mixed in the second resin film 57A2 are exposed. As these fillers, $Al_2O_3$, AlN or the like is typically used. Note that, if a residue remains in the bottom of the through-hole 72 after the laser processing described above, cleaning for removing this residue is performed.

Furthermore, in order to perform plating processing in the next step, zincate processing is performed as preparation.

With reference to FIGS. 21 and 22, next, a description will be given of a step of forming a second connection part 65B by forming a plated film in the through-hole 72, and thus connecting the first conductive film 68A and the second conductive film 68B. There are considered two methods for forming the plated film. The first method is a method for forming a plated film by electroless plating and, thereafter, forming a plated film again by electrolytic plating. The second method is a method for forming a plated film only by electrolytic plating.

Figure 21A:
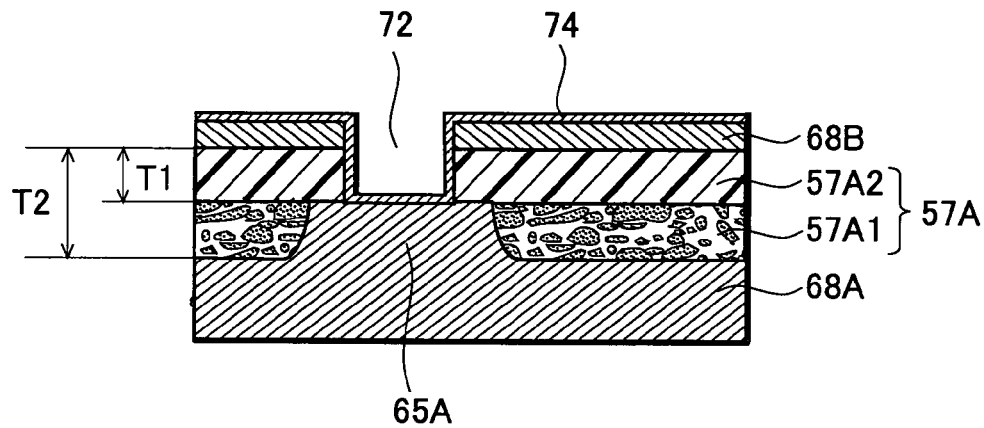
FIGS. 21A to 21C are cross-sectional views showing the method for manufacturing a circuit device of the preferred embodiment of the present invention.
Figure 21B:
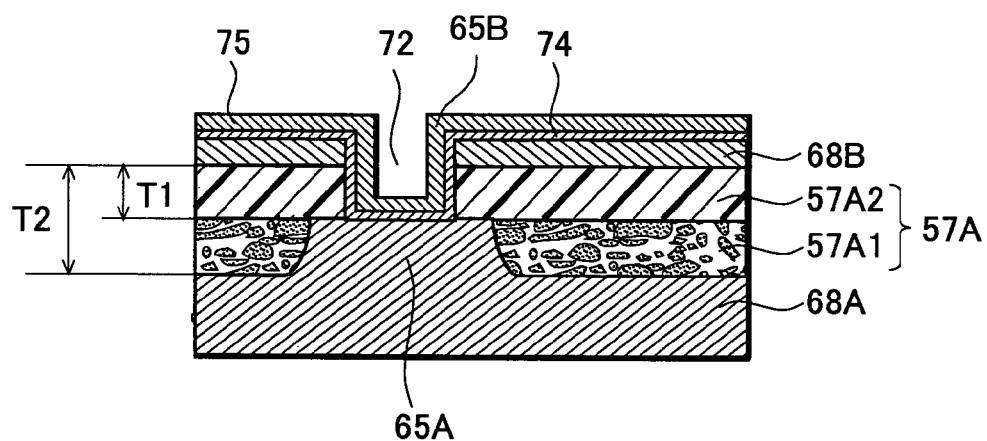
Figure 21C:
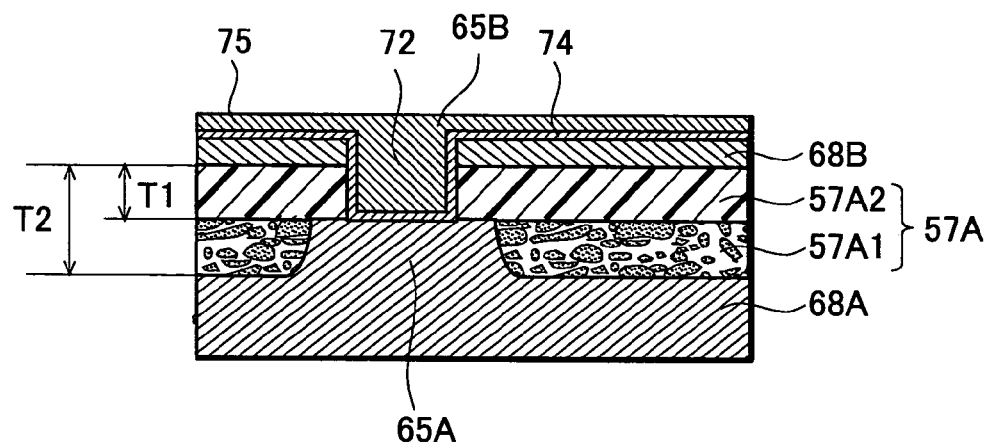

With reference to FIGS. 21A to 21C, the foregoing first method for forming a plated film will be described. First, with reference to FIG. 21A, a plated film 74 is formed by electroless plating on the surface of the second conductive film 68B including the sidewall of the through-hole 72. A thickness of the plated film 74 may be about 3 μm to 5 μm.

Next, with reference to FIG. 21B, a new plated film 75 is formed on the plated film 74 by electrolytic plating. To be more specific, by use of the second conductive film 68B having the plated film 74 formed thereon as a cathode electrode, the plated film 75 is formed by electrolytic plating. By the electroless plating described above, the plated film 74 is formed on the inner wall of the through-hole 72. Therefore, the plated film 75 formed here is formed to have a uniform thickness including the inner wall of the through-hole 72. Thus, the second connection part 65B formed of the plated film is formed. Specifically, a thickness of the plated film 75 is, for example, about 20 μm. As a material of the plated films 74 and 75 described above, copper that is the same material as that of the second conductive film 68B can be used. Moreover, metal other than copper can be used as the material of the plated films 74 and 75.

With reference to FIG. 21C, here, filling plating is performed to fill the through-hole 72 with the plated film 75. By performing the filling plating, mechanical strength of the second connection part 65B can be improved.

Next, with reference to FIGS. 22A to 22C, a description will be given of a method for forming the second connection part 65B by electrolytic plating.

Figure 22A:
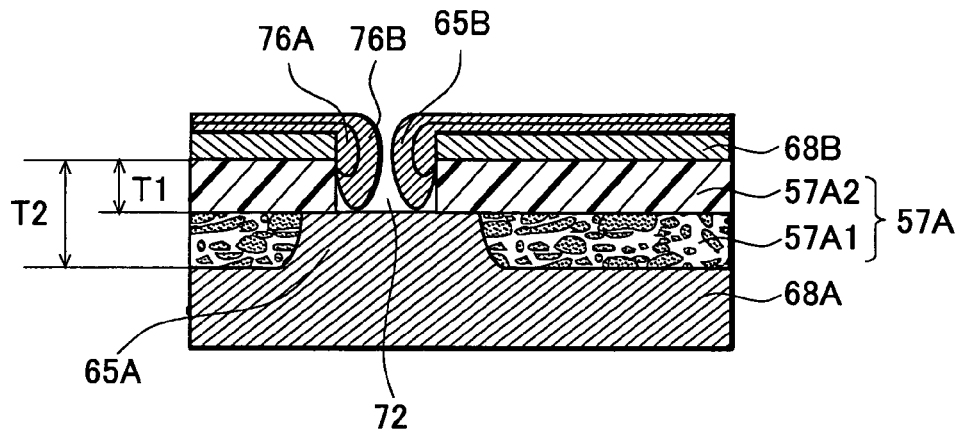
FIGS. 22A to 22C are cross-sectional views showing the method for manufacturing a circuit device of the preferred embodiment of the present invention.

With reference to FIG. 22A, first, a solution containing metal ions is allowed to come into contact with the through-hole 72. Here, as a material of a plated film, copper, gold, silver, palladium or the like can be used. When a current is allowed to flow by use of the second conductive film 68B as a cathode electrode, the metal is deposited on the second conductive film 68B that is the cathode electrode, and a plated film is formed. Here, reference numerals 76A and 76B indicate a state where the plated film is grown.

Figure 22B:
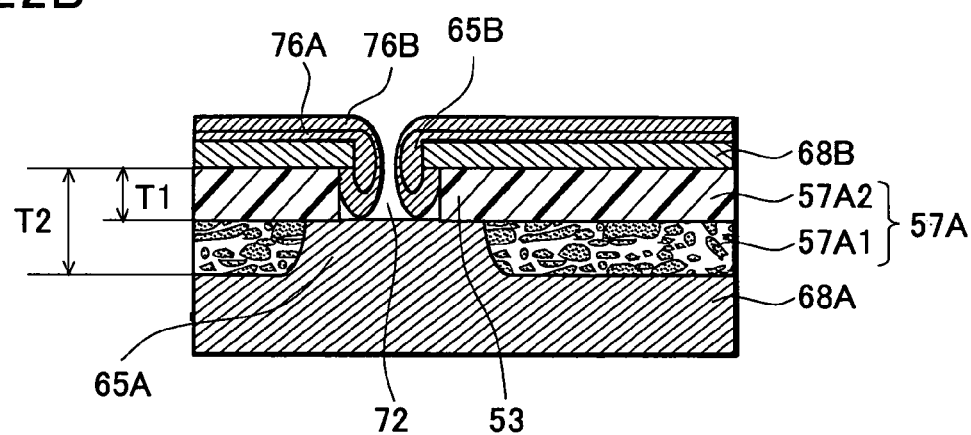

With reference to FIG. 22B, next, a description will be given of another method for forming the second connection part 65B. Here, a canopy top 53 is provided in a peripheral portion of the through-hole 72. Thus, the second connection part 65B is easily formed by electrolytic plating.

Figure 22C:
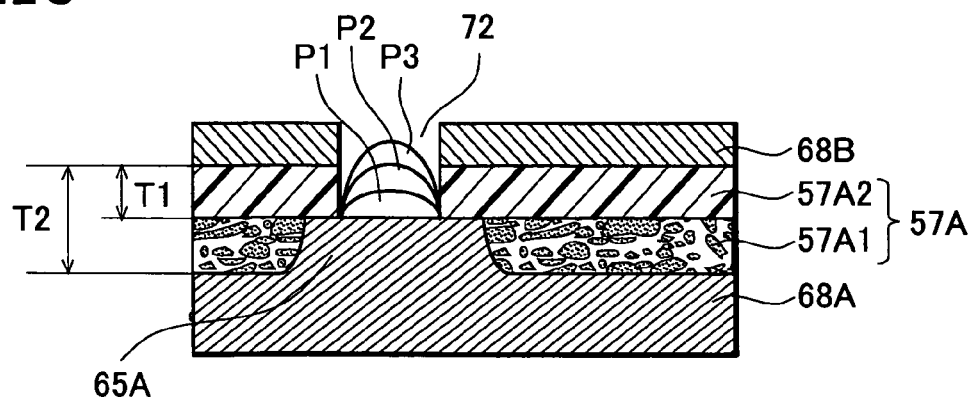

With reference to FIG. 22C, next, a description will be given of the method for forming the second connection part 65B. Here, by performing electrolytic plating using the first conductive film 68A as a cathode electrode, the second connection part 65B is formed. Reference numerals P1 to P3 show how a plated film is grown. As described above, by electrolytic plating, a plated film is preferentially formed in a spot with a strong electric field. Accordingly, the plated film is formed from the upper surface of the first connection part 65A. A formation process of the plated film is P1 to P2 to P3. The second connection part 65B is completed by electrically connecting the plated film and the second conductive film 68B. By use of the method described above, the plated film can be grown upward. Therefore, the through-hole 72 can be surely filled with the plated film. Moreover, by use of the method described above, since there is a very small increase in the thickness of the second conductive film 68B due to adhesion of the plated film, the second conductive film 68B can be maintained to be thin.

The sidewall of the through-hole 72 of this embodiment has irregularities. Moreover, the inorganic fillers mixed in the first insulating layer 57A are exposed on the sidewall of the through-hole 72. Accordingly, it is difficult to form a plated film on the sidewall of the through-hole 72. Generally, a plated film is hardly attached to the surface of inorganic fillers. Particularly, if AlN is exposed on the sidewall of the through-hole 72, it is difficult to form a plated film. Thus, in this embodiment, the second connection part 65B is formed by use of the method using the electrolytic plating described above.

Furthermore, in this embodiment, by forming a plated film in the through-hole 72, a plated film is inevitably formed on the surface of the second conductive film 68B, and the thickness thereof is increased. However, in this embodiment, since the plated film is formed in the through-hole 72 which is as shallow as about 10 μm as described above, the total thickness of the plated films formed can be reduced. Therefore, since there is a small increase in the thickness of the second conductive film 68B due to adhesion of the plated film, the second conductive film 68B can be maintained to be thin. Thus, the second wiring layer 58B formed of the second conductive film 68B can be made minute.

Furthermore, also in the case where the through-hole 72 is filled up by filling plating, since the through-hole 72 is formed to be shallow as described above, filling plating can be easily performed.

Figure 23A:
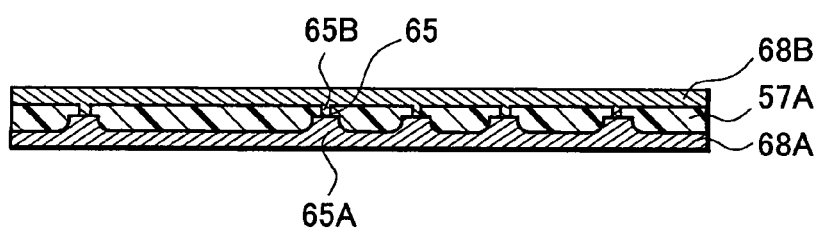
FIGS. 23A to 23C are cross-sectional views showing the method for manufacturing a circuit device of the preferred embodiment of the present invention.
Figure 23B:
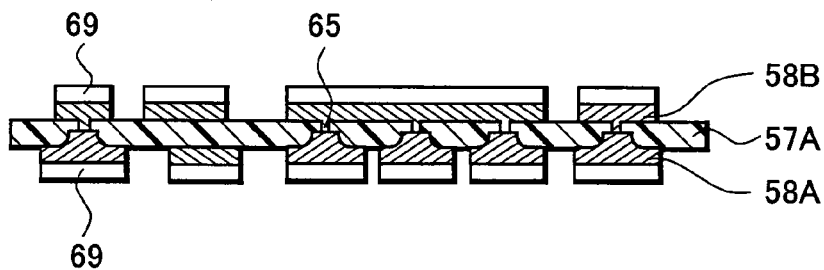

With reference to FIG. 23A, by forming the second connection part 65B, a connection part 65 including the first and second connection parts 65A and 65B is formed. Moreover, with reference to FIG. 23B, by performing selective etching using the resist 69, a second wiring layer 58B is formed. Similarly, by selectively etching the first conductive film 68A, a first wiring layer 58A is formed.

Figure 23C:
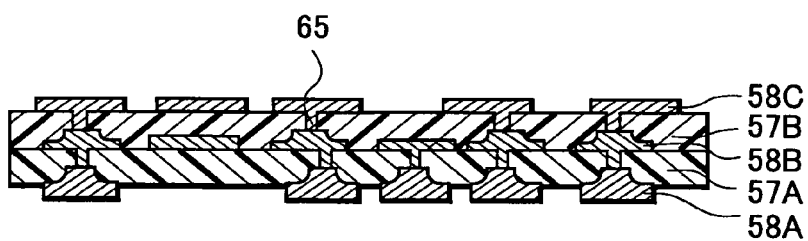

With reference to FIG. 23C, here, a three-layer wiring structure including the first to third wiring layers 58A to 58C is formed. In this case, the connection parts 65 protruded in a convex shape are formed on both the upper and lower surfaces of the second wiring layer 58B.

Figure 24A:
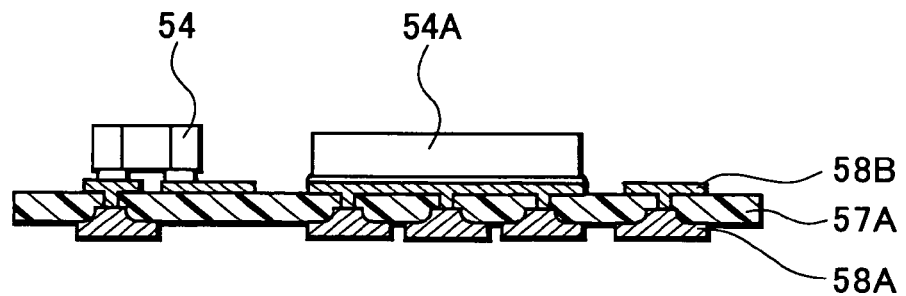
FIGS. 24A to 24C are cross-sectional views showing the method for manufacturing a circuit device of the preferred embodiment of the present invention.
Figure 24B:
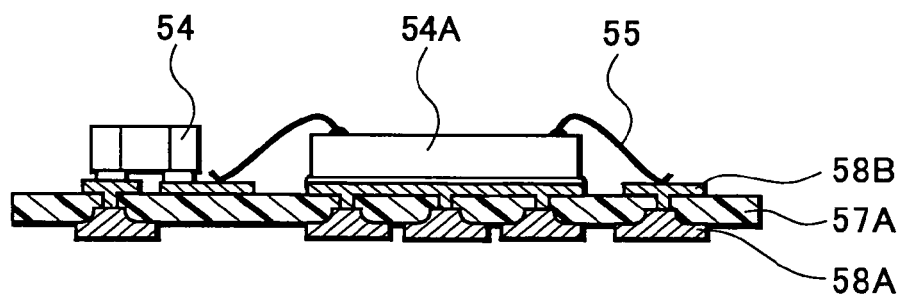
Figure 24C:
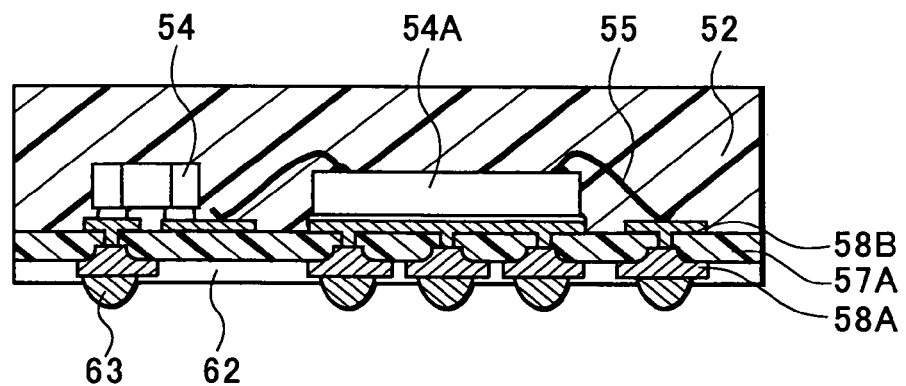
Figure 25:
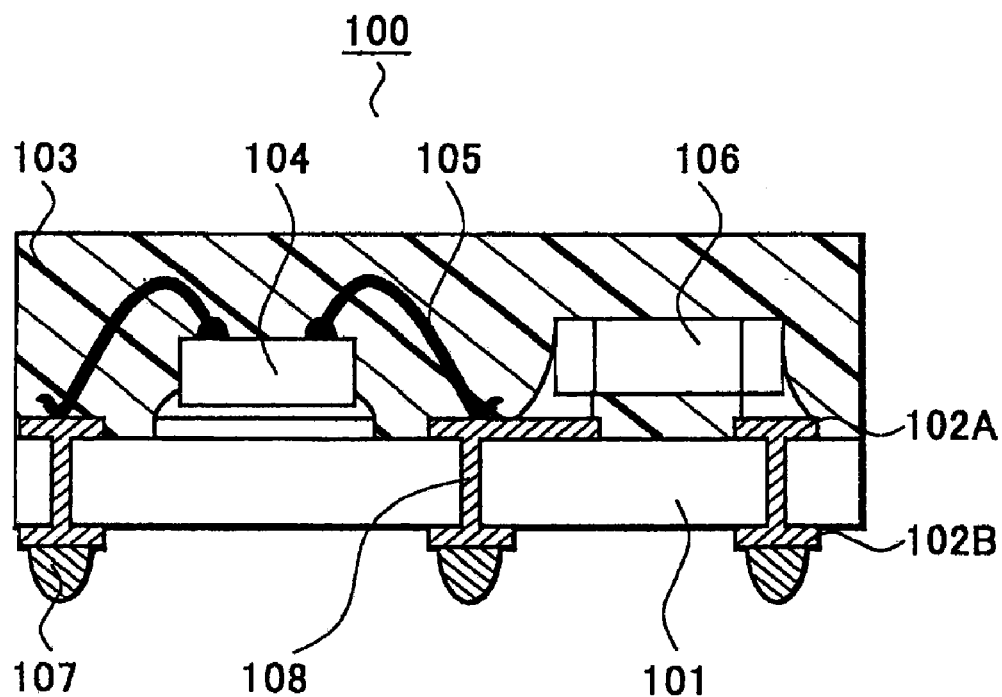
FIG. 25 is a perspective view showing a conventional circuit device.
Figure 26A:
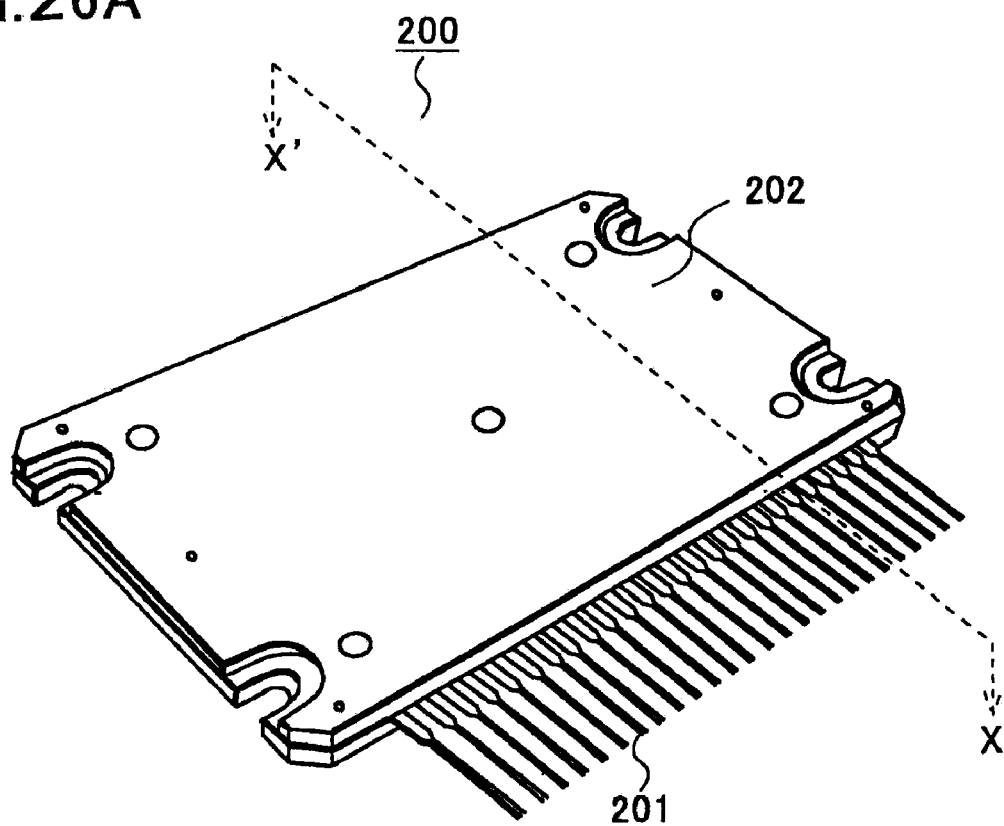
FIG. 26A is a perspective view and FIG. 26B is a cross-sectional view showing a conventional hybrid integrated circuit device.
Figure 26B:
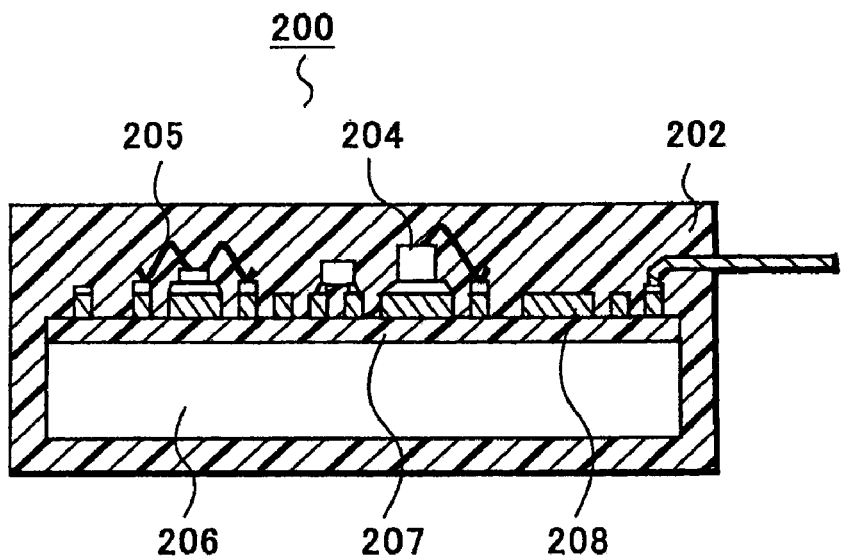

With reference to FIG. 24A, next, a circuit element 54 and a semiconductor element 54A are fixed onto the second wiring layer 58B (island) by use of solder, a conductive paste or the like. Moreover, with reference to FIG. 24B, the circuit element 54 and the second wiring layer 58B are electrically connected to each other through thin metal wires 55. Thus, an electric circuit is formed. With reference to FIG. 24C, the electric circuit is sealed with a sealing resin 52. After a solder resist 62 is formed so as to cover the first wiring layer 58A, external electrodes 63 are formed in predetermined positions. By the steps described above, the circuit device of this embodiment is manufactured.

What is claimed is:

1. A method for manufacturing a board for mounting a circuit element, the method comprising:
   forming a first connection part protruded in a thickness direction on a surface of a first conductive film;
   laminating a second conductive film on an insulating layer containing fillers which is formed directly on the surface of the first conductive film to bury the first connection part;
   partially removing the second conductive film corresponding to a region where the first connection part is formed;
   forming a through-hole by removing the insulating layer in a region thinly formed by burying the first connection part, and exposing an upper surface of the first connection part to the lower side of the through-hole;
   connecting the first conductive film and the second conductive film by forming a second connection part in the through-hole; and
   forming a first wiring layer and a second wiring layer by patterning the first conductive film and the second conductive film, wherein
      the insulating layer is formed of a first resin film containing fillers and a second resin film which covers the upper surface of the first resin film and contains fewer fillers than the first resin film, and
   the through-hole is formed by removing only the second resin film positioned above the first connection part.

2. A method for manufacturing a board for mounting a circuit element, the method comprising:
   forming a first connection part protruded in a thickness direction on a surface of a first conductive film;
   laminating a second conductive film on an insulating layer containing fillers which is formed on the surface of the first conductive film to bury the first connection part, wherein the insulating layer is formed of a first resin film containing fillers and a second resin film which covers the upper surface of the first resin film and does not contain fillers;
   partially removing the second conductive film corresponding to a region where the first connection part is formed;
   forming a through-hole by removing the insulating layer in a region thinly formed by burying the first connection part, and exposing an upper surface of the first connection part to the lower side of the through-hole, wherein the through-hole is formed by removing the second resin film positioned above the first connection part;
   connecting the first conductive film and the second conductive film by forming a second connection part in the through-hole; and
   forming a first wiring layer and a second wiring layer by patterning the first conductive film and the second conductive film.

3. The method for manufacturing a board for mounting a circuit element according to claims 1 or 2, wherein the throughhole is formed in such a manner that the insulating layer is exposed by partially removing the second conductive film, and the exposed insulating layer is irradiated with a laser and removed.

4. The method for manufacturing a board for mounting a circuit element according to claims 1 or 2, wherein, after a plated film is formed on the sidewall of the through-hole by electroless plating, electrolytic plating is performed to form a new plated film in the through-hole, and the first and second conductive films are connected to each other.

5. The method for manufacturing a board for mounting a circuit element according to claim 4, wherein, before the plated film is formed, metal different from the plated film is attached to the sidewall of the through-hole.

6. The method for manufacturing a board for mounting a circuit element according to claims 1 or 2, wherein, by performing electrolytic plating using the second conductive film as an electrode, a plated film is formed toward the center of the through-hole from the second conductive film positioned around the through-hole, and the first and second conductive films are connected to each other by use of the plated film.

7. The method for manufacturing a board for mounting a circuit element according to claims 1 or 2, wherein, by performing electrolytic plating using the first conductive film as an electrode, a plated film is formed toward the center of the through-hole from the first conductive film exposed to the lower side of the through-hole, and the first and second conductive films are connected to each other by use of the plated film.

8. The method of manufacturing a board for mounting a circuit element according to claim 1 or 2 further comprising:
   connecting a circuit element electrically to at least one of the wiring layers.

9. A method for manufacturing a board for mounting a circuit element, the method comprising:
   forming a first connection part protruded in a thickness direction on a surface of a first conductive film;
   laminating a second conductive film on an insulating layer containing fillers which is formed on the surface of the first conductive film to bury the first connection part;
   partially removing the second conductive film corresponding to a region where the first connection part is formed;
   forming a through-hole by removing the insulating layer in a region thinly formed by burying the first connection part, and exposing an upper surface of the first connection part to the lower side of the through-hole;
   connecting the first conductive film and the second conductive film by forming a second connection part in the through-hole;
   forming a first wiring layer and a second wiring layer by patterning the first conductive film and the second conductive film;
   performing electrolytic plating using the second conductive film as an electrode, a plated film is formed toward the center of the through-hole from the second conductive film positioned around the through-hole, and the first and second conductive films are connected to each other by use of the plated film; and
   forming a canopy top made of the second conductive film around the through-hole, and the plated film is formed toward the center of the through-hole from the canopy top.

* * * * *